(12) United States Patent
Hong et al.

(10) Patent No.: US 9,893,087 B2
(45) Date of Patent: Feb. 13, 2018

(54) THIN FILM TRANSISTOR SUBSTRATE, DISPLAY APPARATUS INCLUDING THIN FILM TRANSISTOR SUBSTRATE, METHOD OF MANUFACTURING THIN FILM TRANSISTOR SUBSTRATE, AND METHOD OF MANUFACTURING DISPLAY APPARATUS

(71) Applicant: SAMSUNG DISPLAY CO., LTD., Yongin-si, Gyeonggi-Do (KR)

(72) Inventors: Sangmok Hong, Yongin-si (KR); Moosoon Ko, Yongin-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 0 days.

(21) Appl. No.: 14/955,517

(22) Filed: Dec. 1, 2015

(65) Prior Publication Data
US 2016/0307931 A1    Oct. 20, 2016

(30) Foreign Application Priority Data
Apr. 14, 2015    (KR) .......................... 10-2015-0052458

(51) Int. Cl.
*H01L 27/14*    (2006.01)
*H01L 27/12*    (2006.01)
*H01L 27/32*    (2006.01)

(52) U.S. Cl.
CPC ........ *H01L 27/1222* (2013.01); *H01L 27/124* (2013.01); *H01L 27/1259* (2013.01); *H01L 27/3223* (2013.01); *H01L 27/3276* (2013.01); *H01L 2227/323* (2013.01)

(58) Field of Classification Search
CPC .............. H01L 27/1222; H01L 27/124; H01L 27/1259; H01L 27/3223; H01L 27/3276; H01L 2227/323
See application file for complete search history.

(56) References Cited

U.S. PATENT DOCUMENTS

| 8,785,318 B2* | 7/2014 | Suzuki .............. H01L 21/76819 257/737 |
| 2005/0180721 A1 | 8/2005 | Hayashi et al. |
| 2006/0124933 A1 | 6/2006 | Kang |
| 2013/0244414 A1 | 9/2013 | Song et al. |
| 2015/0103284 A1* | 4/2015 | Nagasawa ......... G02F 1/134336 349/46 |

FOREIGN PATENT DOCUMENTS

| JP | 2005222860 | 8/2005 |
| KR | 1020060066512 | 6/2006 |
| KR | 100762686 | 9/2007 |

* cited by examiner

*Primary Examiner* — Mark Tornow
(74) *Attorney, Agent, or Firm* — F. Chau & Associates, LLC

(57) ABSTRACT

A thin film transistor TFT substrate includes a substrate, a first conductive pattern that extends on the substrate in a first direction, a second conductive pattern located on the same layer as the first conductive pattern and nearest to a first side of the first conductive pattern in a second direction that is perpendicular to the first direction, and a dummy pattern located on the same layer as the first conductive pattern and located adjacent a second other side of the first conductive pattern which is opposite to the first side of the first conductive pattern.

13 Claims, 10 Drawing Sheets

THIN FILM TRANSISTOR SUBSTRATE, DISPLAY APPARATUS INCLUDING THIN FILM TRANSISTOR SUBSTRATE, METHOD OF MANUFACTURING THIN FILM TRANSISTOR SUBSTRATE, AND METHOD OF MANUFACTURING DISPLAY APPARATUS

CROSS-REFERENCE TO RELATED APPLICATION

This application claims priority under 35 U.S.C. §119 to Korean Patent Application No. 10-2015-0052458, filed on Apr. 14, 2015, in the Korean Intellectual Property Office KIPO, the disclosure of which is incorporated by reference in its entirety herein.

TECHNICAL FIELD

Exemplary embodiments of the present inventive concept relate to a thin film transistor (TFT) substrate, a display apparatus including the TFT substrate, a method of manufacturing the TFT substrate, and a method of manufacturing the display apparatus, and more particularly, to a TFT substrate in which current leakage from lines is prevented or reduced even under high-resolution conditions, a display apparatus including the TFT substrate, a method of manufacturing the TFT substrate, and a method of manufacturing the display apparatus.

DISCUSSION OF RELATED ART

In general, a thin film transistor (TFT) substrate refers to a structure in which at least one TFT is formed on a substrate. A display apparatus may be manufactured by using the TFT substrate.

A TFT in the TFT substrate includes an active pattern and a gate electrode that functions as a semiconductor layer. An insulating layer is formed on the gate electrode to insulate a line portion and electrodes on the gate electrode from each other. However, if cracks develop in the insulating layer, a leakage current may develop.

Thus, there is a need for a TFT substrate that can reduce or prevent this leakage current.

SUMMARY

At least one embodiment of the inventive concept provides a thin film transistor TFT substrate in which current leakage from signal lines of TFT substrate may be prevented or reduced even under high-resolution conditions, a display apparatus including the TFT substrate, a method of manufacturing the TFT substrate, and a method of manufacturing the display apparatus.

According to an exemplary embodiment of the inventive concept, a TFT substrate includes a substrate, a first conductive pattern that is located on the substrate and extends in a first direction, a second conductive pattern located on the same layer as the first conductive pattern and is nearest to the first conductive pattern among conductive patterns located adjacent a first side of the first conductive pattern in a second direction that is perpendicular to the first direction, and a dummy pattern unit located on the same layer as the first conductive pattern and adjacent a second side of the first conductive pattern which is opposite to the first side of the first conductive pattern.

According to an exemplary embodiment, the first and second conductive patterns are spaced apart by a first distance, and the first conductive pattern and the dummy pattern unit is spaced apart by a second distance that is equal to or less than the first distance.

According to an exemplary embodiment, the dummy pattern unit includes a plurality of dummy patterns that are connected to or spaced apart from each other.

According to an exemplary embodiment, the plurality of dummy patterns are arranged in a zigzag pattern.

According to an exemplary embodiment, the TFT substrate further includes a third conductive pattern located on the same layer as the first conductive pattern, nearest to the first conductive pattern among conductive patterns located adjacent a side of the dummy pattern unit which is opposite to another side of the dummy pattern unit where the first conductive pattern is located adjacently, and extending in the same first direction as the first conductive pattern. The third conductive pattern is spaced apart from the first conductive pattern by a third distance that is greater than the first distance.

According to an exemplary embodiment, the TFT substrate further includes a TFT that includes an active pattern and the second conductive pattern, where the second conductive pattern comprises a gate electrode that overlaps a portion of the active pattern.

According to an exemplary embodiment, the TFT substrate further includes a third conductive pattern located on the same layer as the first conductive pattern and nearest to the first conductive pattern among conductive patterns located adjacent a side of the dummy pattern unit which is opposite to another side of the dummy pattern unit where the first conductive pattern is located adjacently. The third conductive pattern is spaced apart from the first conductive pattern by a third distance that is greater than the first distance.

According to an exemplary embodiment, the TFT substrate further includes a first TFT that includes a first active pattern and the second conductive pattern, where the second conductive pattern comprises a first gate electrode that overlaps a portion of the first active pattern, a first pixel electrode that is electrically connected to the first TFT, a second TFT that includes a second active pattern and the third conductive pattern, where the third conductive pattern comprises a second gate electrode that overlaps a portion of the second active pattern, and a second pixel electrode that is electrically connected to the second TFT.

According to an exemplary embodiment, a display apparatus includes the TFT substrate described above, and a display panel or device is located on the TFT substrate.

According to an exemplary embodiment of the inventive concept, a method of manufacturing a TFT substrate includes forming, on a substrate, a first conductive pattern to extend in a first direction, forming a second conductive pattern at a position nearest to the first conductive pattern among conductive patterns located adjacent a first side of the first conductive pattern in a second direction that is perpendicular to the first direction, and forming a dummy pattern adjacent a second side of the first conductive pattern that is opposite to the first side of the first conductive pattern. In an exemplary embodiment, the forming of the first conductive pattern, the forming of the second conductive pattern, and the forming of the dummy pattern unit are performed at the same time or by the same process.

According to an exemplary embodiment, the first and second conductive patterns are spaced apart by a first distance, and the first conductive pattern and the dummy pattern unit is spaced apart by a second distance that is equal to or less than the first distance.

According to an exemplary embodiment, the dummy pattern unit includes a plurality of dummy patterns that are connected to or spaced apart from each other.

According to an exemplary embodiment, the plurality of dummy patterns are arranged in a zigzag pattern.

According to an exemplary embodiment, the method further includes forming a third conductive pattern to extend in the same first direction as the first conductive pattern and at a position is located nearest to the first conductive pattern among conductive patterns located adjacent a side of the dummy pattern unit which is opposite to another side of the dummy pattern unit where the first conductive pattern is located. The forming of the third conductive pattern and the forming of the first conductive pattern may be performed at the same time or by the same process, and the third conductive pattern is spaced apart from the first conductive pattern by a third distance that is greater than the first distance.

According to an exemplary embodiment, the method further includes prior to forming the second conductive pattern, forming an active pattern, where the second conductive pattern comprises a gate electrode that overlaps a portion of the active pattern, and the second conductive pattern and the active pattern are part of a TFT.

According to an exemplary embodiment, the method further includes forming a third conductive pattern at a position nearest to the first conductive pattern among conductive patterns located adjacent a side of the dummy pattern unit which is opposite to another side of the dummy pattern unit where the first conductive pattern is located adjacently. The forming of the third conductive pattern and the forming of the first conductive pattern may be performed at the same time or by the same process, and the third conductive pattern is spaced apart from the first conductive pattern by a third distance that is greater than the first distance.

According to an exemplary embodiment, the method further includes prior to forming the second conductive pattern, forming a first active pattern, wherein the second conductive pattern comprises a first gate electrode that overlaps at least a portion of the first active pattern, where the first active pattern and the first gate electrode are part of a first TFT, forming a first pixel electrode that is electrically connected to the first TFT, prior to forming the third conductive pattern, forming a second active pattern, where the third conductive pattern comprises a second gate electrode that overlaps a portion of the second active pattern, the second active pattern and the second gate electrode being part of a second TFT, and forming a second pixel electrode that is electrically connected to the second TFT.

According to an exemplary embodiment, a method of manufacturing a display apparatus includes forming a display panel on a thin film transistor (TFT) substrate that is manufactured according to the method described above.

According to an exemplary embodiment of the inventive concept, a display device includes a substrate comprising first and second pixels that are adjacent one another, a dummy pattern located between the first and second pixels, and a first conductive pattern located on the substrate between the dummy pattern and the first pixel. The first pixel comprises a first thin film transistor TFT, the first TFT comprising a second conductive pattern located on a same layer as the first conductive pattern and adjacent a side of the first conductive pattern that is opposite a side of the first conductive pattern adjacent the dummy pattern.

According to an exemplary embodiment, the dummy pattern is located a first distance away from the first conductive pattern, wherein the second pixel comprises a second TFT, and wherein the second TFT comprises a third conductive pattern that is located a second distance away from the first conductive pattern that is larger than the first distance.

One or more these embodiments may be implemented by using a system, a method, a computer program, or a combination thereof.

BRIEF DESCRIPTION OF THE DRAWINGS

The inventive concept will become more apparent by describing in detail exemplary embodiments thereof with reference to the accompanying drawings in which.

DETAILED DESCRIPTION OF THE EXEMPLARY EMBODIMENTS

Figure 1:
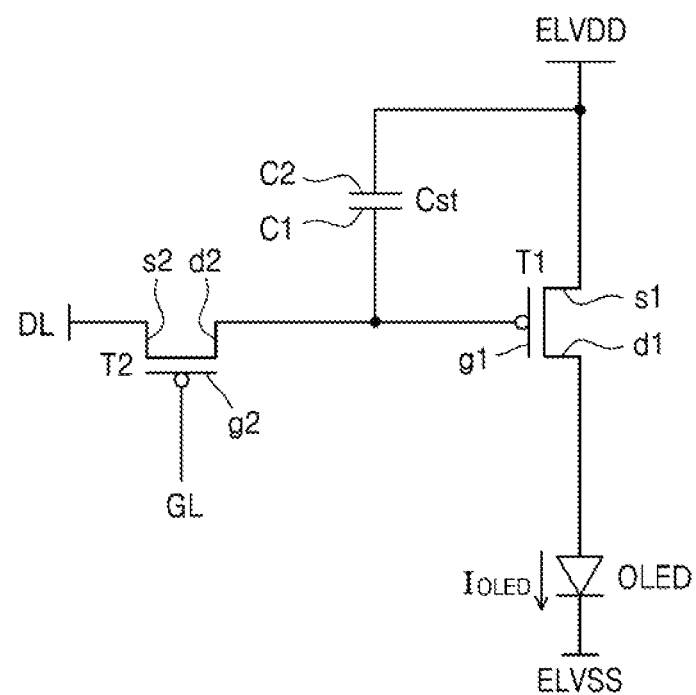
FIG. 1 is an equivalent circuit diagram of a pixel of a thin film transistor (TFT) substrate according to an exemplary embodiment of the inventive concept.

Hereinafter, exemplary embodiments of the inventive concept will be explained in detail with reference to the accompanying figures. Like reference numerals in the drawings denote like elements, and thus their description will not be repeated. However, this is not intended to limit the inventive concept to particular modes of practice, and it is to be appreciated that all changes, equivalents, and substitutes that do not depart from the spirit and technical scope are encompassed in the inventive concept. As used herein, the term "and/or" includes any and all combinations of one or more of the associated listed items.

As used herein, the singular forms "a," "an" and "the" are intended to include the plural forms as well, unless the context clearly indicates otherwise. It will be understood that when a layer, region, or component is referred to as being "formed on" another layer, region, or component, it can be directly or indirectly formed on the other layer, region, or component. That is, for example, intervening layers, regions, or components may be present.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2:
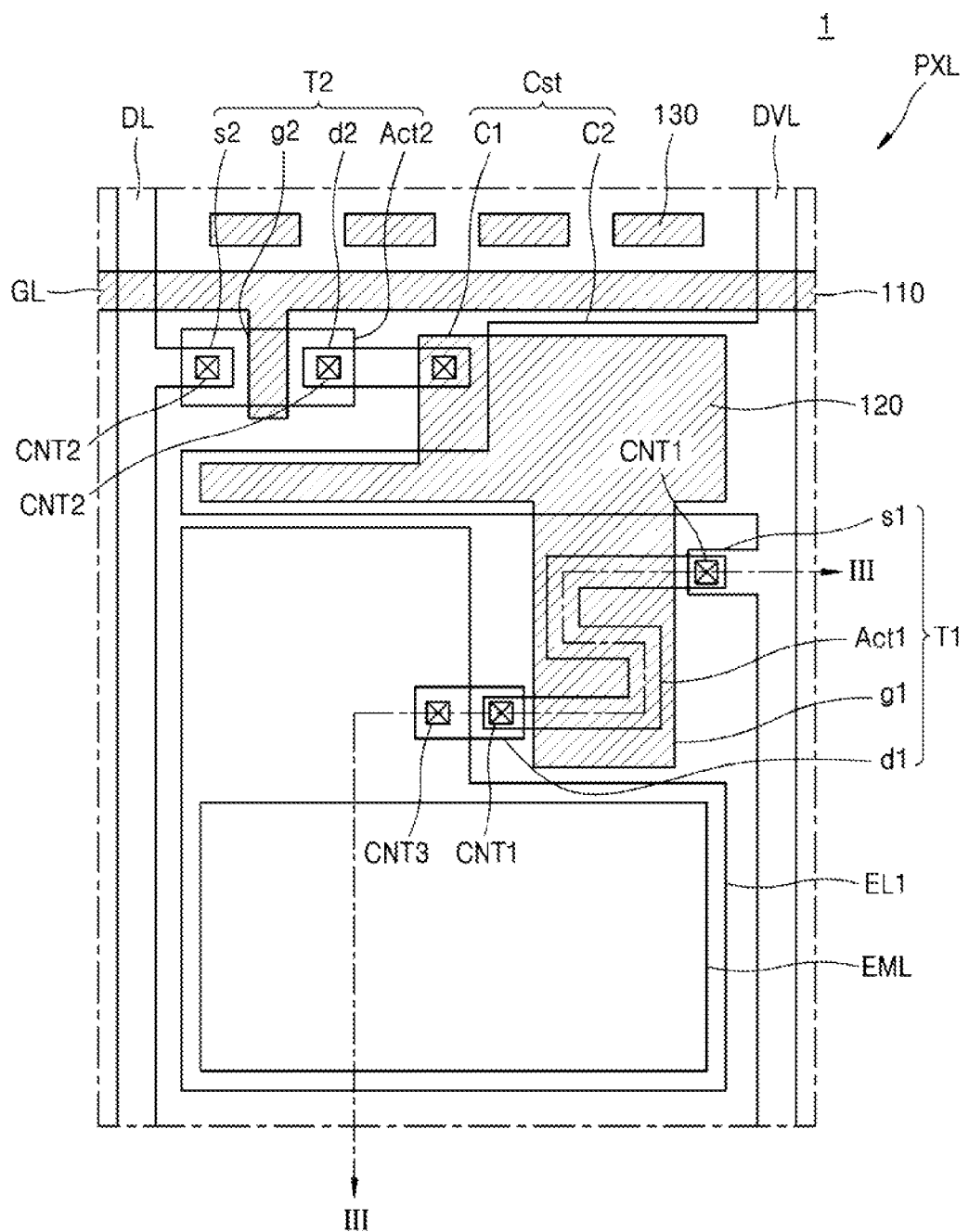
FIG. 2 is a schematic cross-sectional view of the TFT substrate according to the exemplary embodiment of FIG. 1.

FIG. 1 is an equivalent circuit diagram of a pixel of a thin film transistor (TFT) substrate 1 according to an exemplary embodiment of the inventive concept. FIG. 2 is a schematic cross-sectional view of the TFT substrate 1 according to the exemplary embodiment of FIG. 1.

Referring to FIGS. 1 and 2, the TFT substrate 1 according to the present exemplary embodiment includes a substrate 100 (refer to FIG. 3), and a first conductive pattern 110, a second conductive pattern 120, and a dummy pattern 130 located on the substrate 100.

The substrate 100 may be formed of various materials, for example, a glass material, a metallic material, or a plastic material such as polyethylene terephthalate (PET), polyethylene naphthalate (PEN), or polyimide. The substrate 100 may include a display area in which a plurality of pixels PXL are located, and a peripheral area that surrounds the display area.

At least one pixel PXL, which displays an image, is provided on the substrate 100. When there are a plurality of pixels PXL, the pixels PXL may be arranged in a matrix form. However, only one pixel PXL is illustrated in the present exemplary embodiment for convenience of description. Although the pixel PXL is rectangular-shaped in FIG. 2, a shape of the pixel PXL is not limited thereto and may be modified in various ways. Also, the pixels PXL may have different sizes. For example, the pixels PXL with different colors may have different sizes or shapes according to a color of each pixel PXL.

The pixel PXL may include a line portion that includes a gate line GL, a data line DL, and a driving voltage line DVL, TFTs T1 and T2 connected to the line portion, an organic light-emitting device (OLED) connected to the TFTs T1 and T2, and a capacitor Cst. Although the first conductive pattern 110 is illustrated as the gate line GL in the present exemplary embodiment, exemplary embodiments are not limited thereto.

The gate line GL may extend in one direction, and the data line DL may extend in another direction that intersects the gate line GL. The driving voltage line DVL may extend in substantially the same direction as the data line DL. The gate line GL may transmit gate signals (e.g., scan signals) to the TFTs T1 and T2, the data line DL may transmit data signals to the TFTs T1 and T2, and the driving voltage line DVL may supply driving voltages to the TFTs T1 and T2.

The TFT T1 may be referred to as a driving TFT T1 that controls the OLED, and the TFT T2 may be referred to as a switching TFT T2 that switches the driving TFT T1. According to an exemplary embodiment, the pixel PXL includes two TFTs T1 and T2. However, exemplary embodiments are not limited thereto. The pixel PXL may include one TFT and one capacitor or include three or more TFTs and two or more capacitors.

The driving TFT T1 includes a first gate electrode g1, a first source electrode s1, and a first drain electrode d1. The first gate electrode g1 is connected to the switching TFT T2, the first source electrode s1 is connected to the driving voltage line DVL, and the first drain electrode d1 is connected to the OLED. For example, the driving voltage line DVL may supply voltage ELVDD to the first source electrode. The OLED may receive a voltage ELVSS, which is lower than ELVDD. The current passing through the OLED may be referred to as $I_{OLED}$.

The switching TFT T2 includes a second gate electrode g2, a second source electrode s2, and a second drain electrode d2. The second gate electrode g2 is connected to the gate line GL, and the second source electrode s2 is connected to the data line DL. The second drain electrode d2 is connected to a gate electrode of the driving TFT T1 (i.e., the first gate electrode g1). The switching TFT T2 transmits the data signals that are applied to the data line DL to the driving TFT T1 according to the scan signals that are applied to the gate line GL.

A display device may be further arranged on the TFT substrate 1. Although an OLED is arranged as the display device according to the present exemplary embodiment, exemplary embodiments are not limited thereto. For example, a liquid crystal display (LCD) may be arranged as the display device. The OLED may include an emission layer EML, and a first electrode EL1 and a second electrode EL2 that face each other with the emission layer EML located therebetween. The first electrode EL1 is connected to the first drain electrode d1 of the driving TFT T1. A common voltage is applied to the second electrode EL2, and the emission layer EML may display an image by emitting light according to output signals of the driving TFT T1.

The capacitor Cst is connected to an area between the first gate electrode g1 and the first source electrode s1 of the driving TFT T1, and may charge and maintain the data signals that are input to the first gate electrode g1 of the driving TFT T1.

The plan view in FIG. 2 that corresponds to the equivalent circuit diagram of FIG. 1 is only an example. The plan view of the TFT substrate 1 may vary in alternate embodiments.

Figure 3:
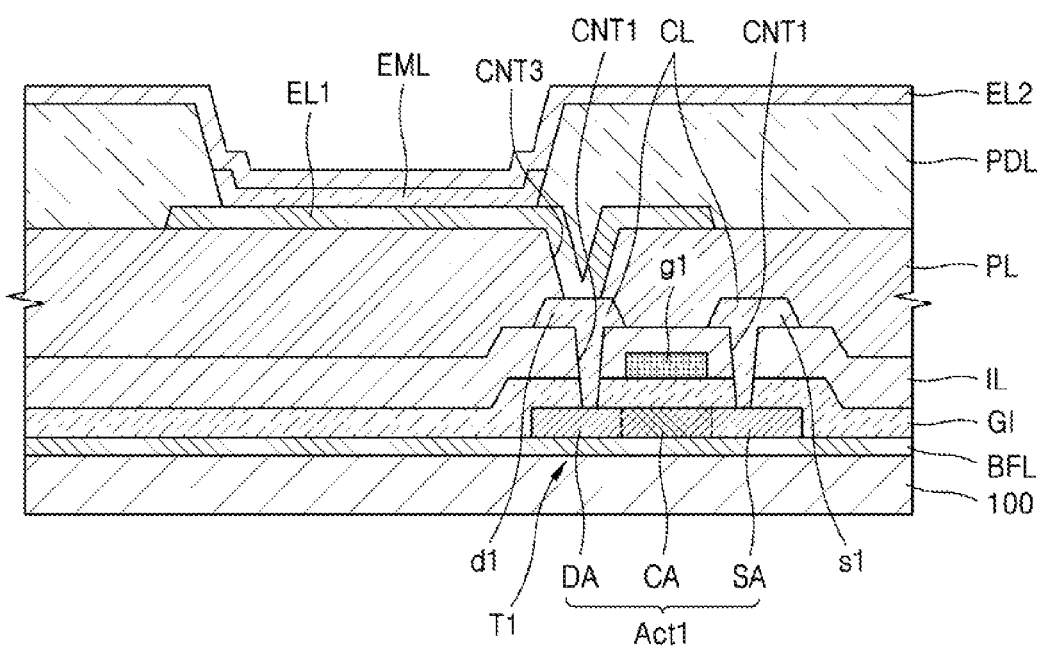
FIG. 3 is a schematic cross-sectional view of the TFT substrate of FIG. 2, cut along the line III-III of FIG. 2.

FIG. 3 is a schematic cross-sectional view of the TFT substrate 1 of FIG. 2, cut along the line III-III' of FIG. 2. Hereinafter, referring to FIG. 3, the TFT substrate 1 according to an exemplary embodiment will be described according to a stacking order.

The TFT substrate 1 according to an exemplary embodiment includes the substrate 100 that has an insulating property. The TFTs T1 and T2 and the capacitor Cst are stacked on the substrate 100. An LCD or an OLED may be arranged on the TFT substrate 1. The present exemplary embodiment discloses an example in which the OLED is arranged on the TFT substrate 1.

Referring to FIG. 3, a buffer layer BFL is located on the substrate 100. The buffer layer BFL may planarize an upper surface of the substrate 100 or block impurities from spreading into the driving TFT T1. The buffer layer BFL may be formed of, for example, silicon nitride, silicon oxide, or silicon oxynitride. The buffer layer BFL may be omitted according to a material of the substrate 100 and manufacturing conditions.

A first active pattern Act1 is located on the buffer layer BFL. The first active pattern Act1 may be formed of a semiconductor material and include amorphous silicon, polycrystalline silicon, or an organic semiconductor material. The first active pattern Act1 may function as an active layer of the driving TFT T1. The first active pattern Act1 may include a source area SA, a drain area DA, and a channel area CA provided between the source and drain areas SA and DA. The source and drain areas SA and DA of the first active pattern Act1 may be doped with n-type or p-type impurities.

A gate insulating layer GI is located on the first active pattern Act1. The gate insulating layer GI may be formed of, for example, silicon oxide and/or silicon nitride, so that the first active pattern Act1 is insulated from the first gate electrode g1.

The first gate electrode g1 is located on the gate insulating layer GI. The first gate electrode g1 may overlap at least a portion of the first active pattern Act1. For example, the first gate electrode g1 may be located to cover an area of the gate insulating layer GI which corresponds to the channel area CA of the first active pattern Act1. The first gate electrode g1 may be formed by using a conductive metallic material.

An interlayer insulating layer IL is located on the first gate electrode g1 to cover the first gate electrode g1. The interlayer insulating layer IL may be formed as a single layer or multiple layers of silicon oxide or silicon nitride.

The interlayer insulating layer IL may include at least one contact hole CNT1 filled with a conductive material. The conductive material that fills the contact hole CNT1 may be referred to as a conductive layer CL that forms the first source and drain electrodes s1 and d1 of the driving TFT T1. The first electrode EL1 of the OLED and the driving TFT T1 may be electrically connected to each other via the conductive material filled in the contact hole CNT1.

The first source and drain electrodes s1 and d1, i.e., the conductive layer CL, are located on the interlayer insulating layer IL. The first source and drain electrode s1 and d1 respectively contact the source area SA and the drain area DA of the first active pattern Act1 via the contact hole CNT1 formed in the gate insulating layer GI and the interlayer insulating layer IL. Although not illustrated in FIG. 3, the second source and drain electrodes s2 and d2 may respectively contact a source area (not shown) and a drain area (not shown) of a second active pattern (Act2 of FIG. 2) via a contact hole (CNT2 of FIG. 2) formed in the gate insulating layer GI and the interlayer insulating layer IL.

Each of the first source and drain electrodes s1 and d1 may be formed as a single layer formed of at least one conductive material selected from Al, platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), or as multiple layers of the conductive material.

Although not illustrated in FIG. 3, a portion of the first gate electrode g1 and a portion of the driving voltage line DVL are a first capacitor electrode C1 and a second capacitor electrode C2, respectively. The first and second capacitor electrodes C1 and C2, having the interlayer insulating layer IL located therebetween, form the capacitor Cst. The first capacitor electrode C1 may be referred to as an upper electrode of the capacitor Cst, and the second capacitor electrode C2 may be referred to as a lower electrode of the capacitor Cst.

The first capacitor electrode C1 and the first gate electrode g1 may be integrally formed as a single conductive layer. Accordingly, the second conductive pattern 120 may include the first capacitor electrode C1 and the first gate electrode g1. That is, according to a location of the second conductive pattern 120, a side of the second conductive pattern 120 may function as the first gate electrode g1 and another side of the second conductive pattern 120 may function as the first capacitor electrode C1.

A planarizing layer PL may be located on the first source and drain electrodes s1 and d1. The planarizing layer PL may be located to cover the interlayer insulating layer IL and the conductive layer CL. The planarizing layer PL may be formed of, for example, an organic insulating material such as an acryl-based material or benzocyclobutene (BCB). The planarizing layer PL may function as a protection layer that protects the driving and switching TFTs T1 and T2, or as a planarizing layer that planarizes upper surfaces of the driving and switching TFTs T1 and T2.

A display device may be located on the TFT substrate 1. The present exemplary embodiment discloses an example in which an OLED is located as the display device. The OLED may include the first electrode EL1, the second electrode EL2, and an intermediate layer that includes the emission layer EML that is located between the first and second electrodes EL1 and EL2.

The first electrode EL1 of the OLED may be located on the planarizing layer PL. The first electrode EL1 may be a pixel electrode. The first electrode EL1 is electrically connected to the first drain electrode d1 of the driving TFT T1 via a contact hole CNT3 formed in the planarizing layer PL.

The first electrode EL1 may be formed by using a high work function material. If the substrate 100 is a bottom emission type in which an image is displayed in a downward direction with respect to the substrate 100, the first electrode EL1 may be formed as a transparent conductive layer formed of indium tin oxide (ITO), indium zinc oxide (IZO), zinc oxide (ZnO), or indium tin zinc oxide (ITZO). In an embodiment, in the bottom emission type, light emitted passes through the transparent conductive layer. According to an exemplary embodiment, if the substrate 100 is a top emission type in which an image is displayed in an upward direction with respect to the substrate 100, the first electrode EL1 may be formed as a metal reflective film formed of Ag, Mg, Al, Pt, Pd, Au, Ni, Nd, Ir, or Cr, or a transparent conductive layer formed of ITO, IZO, ZnO, or ITZO.

A pixel defining layer PDL that defines an emission area with respect to each pixel is located on the substrate 100, in which the first electrode EL1 and other elements are formed. The pixel defining layer PDL may be formed such that a boundary of a pixel is covered and an upper surface of the first electrode EL1 is exposed.

The emission layer EML is provided on a portion of the first electrode EL1 which is exposed by the pixel defining layer PDL, and the second electrode EL2 is located on the emission layer EML. For example, the pixel defining layer may include a first part and a second part, where the emission layer EML is located between the first and second parts.

Although not illustrated, according to exemplary embodiments, a lower common layer may be located between the first electrode EL1 and the emission layer EML, and an upper common layer may be located between the emission layer EML and the second electrode EL2. The lower common layer and the upper common layer function as carrier transport layers, and may be commonly stacked on each pixel. The lower common layer may include a hole injection layer (HIL) and a hole transport layer (HTL), and the upper common layer may include an electron injection layer (EIL) and an electron transport layer (ETL). According to the present exemplary embodiment, when the first electrode EL1 is a pixel electrode, the lower common layer, the upper common layer, and the emission layer EML are stacked on the first electrode EL1 in the following order: the HIL, the HTL, the emission layer EML, the ETL, and the EIL, and the second electrode EL2. However, exemplary embodiments are not limited thereto, and the lower common layer and the upper common layer may be modified if necessary.

The second electrode EL2 may be a transparent electrode or a reflective electrode. When the second electrode EL2 is formed as a transparent electrode, the second electrode EL2 may include the above-described transparent conductive material. When the second electrode EL2 is formed as a reflective electrode, the second electrode EL2 may include a metal reflective film. The second electrode EL2 may be located on an entire surface of the substrate 100. For example, the second electrode EL2 may entirely cover the first pixel defining layer PDL and the emission layer EML.

When the second electrode EL2 is formed as a (semi) transparent electrode, the second electrode EL2 may include a layer formed of a low work function metal, that is, one selected from Li, Ca, LiF/Ca, LiF/Al, Al, Ag, Mg, and a combination thereof, and a (semi) transparent conductive layer formed of one selected from ITO, IZO, ZnO, and $In_2O_3$. When the second electrode EL2 is formed as a reflective electrode, the second electrode EL2 may include a layer formed of one selected from Li, Ca, LiF/Ca, LiF/Al, Al, Ag, Mg, and a combination thereof. However, a structure and a material of the second electrode EL2 are not limited to the description above and may be modified in various ways.

Although not illustrated, an encapsulating layer (not shown) may be formed on the second electrode EL2. The encapsulating layer may be formed by stacking a plurality of inorganic layers or alternately stacking an organic layer and an inorganic layer.

According to an exemplary embodiment, an encapsulating substrate (not shown) is located on the second electrode EL2. The substrate 100 may be sealed by the encapsulating substrate. In an embodiment, the encapsulating substrate provides a waterproofing feature.

Figure 4:
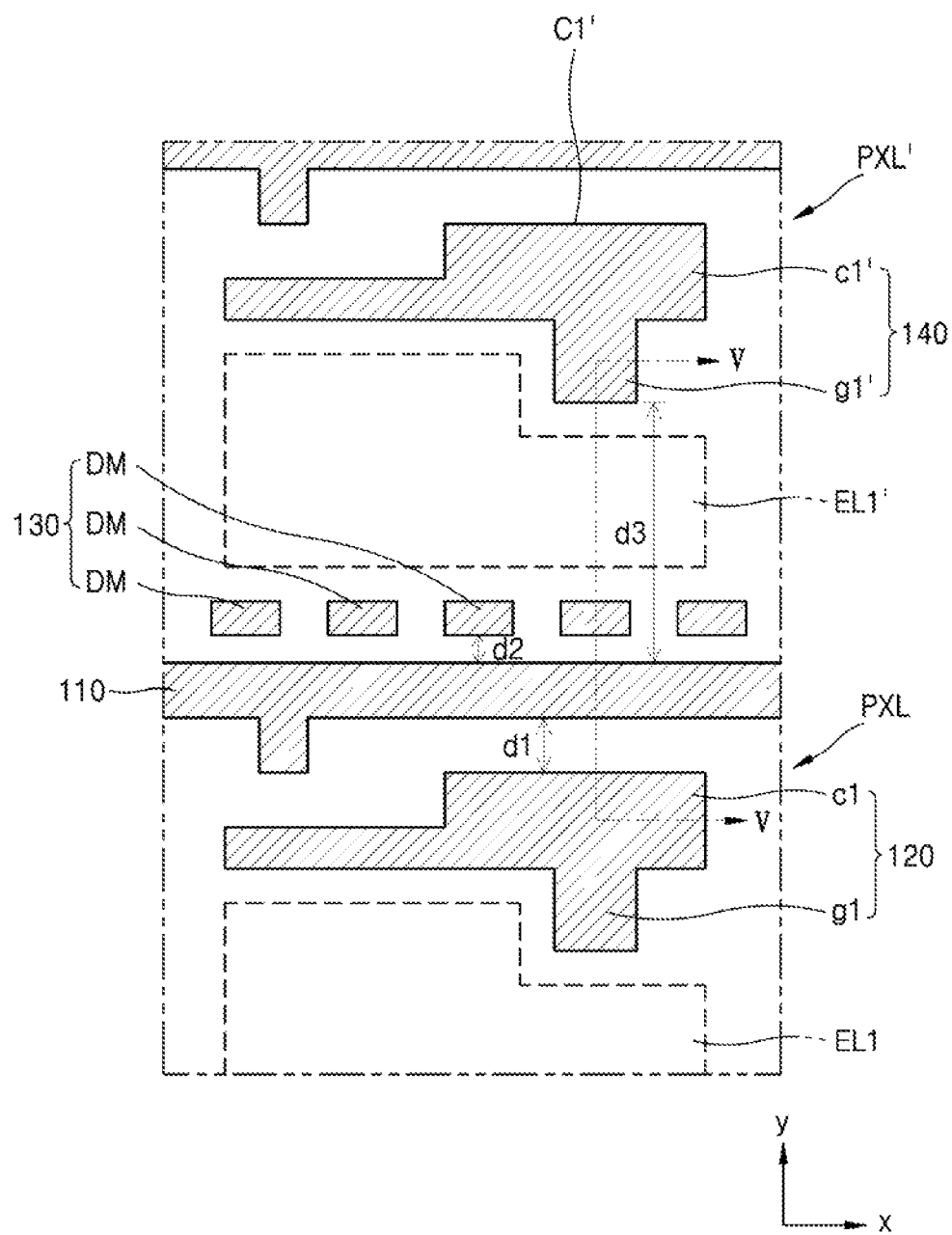
FIG. 4 is a schematic plan view of a layer of the TFT substrate of FIG. 2.
Figure 5:
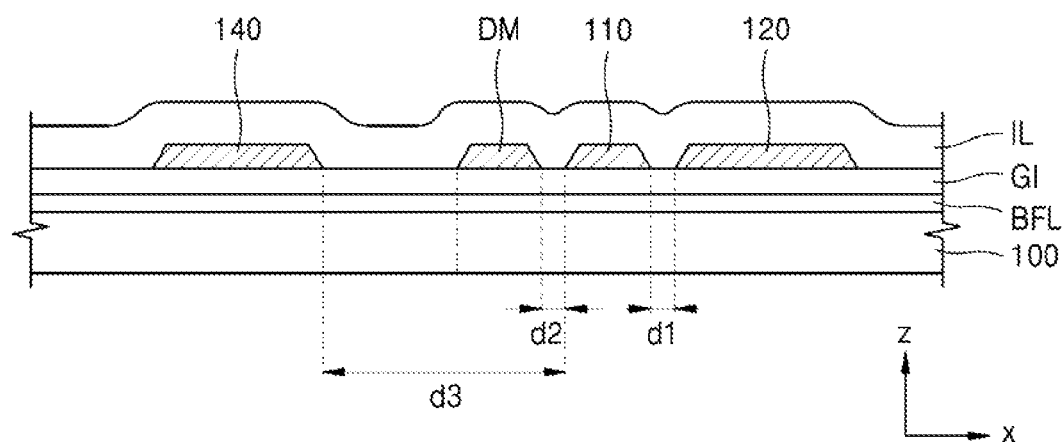
FIG. 5 is a schematic cross-sectional view of the TFT substrate of FIG. 4, cut along the line V-V of FIG. 4.

FIG. 4 is a schematic plan view of a layer of the TFT substrate 1 of FIG. 2. FIG. 5 is a schematic cross-sectional view of the TFT substrate 1 of FIG. 4, cut along the line V-V of FIG. 4.

For convenience of description, a first pixel PXL and a second pixel PXL' that are adjacent to each other are illustrated in FIG. 4. Referring to FIG. 5, conductive patterns 110, 120, and 130 are located on a gate insulating layer GI that is located on the substrate 100. The conductive patterns 110, 120, and 130 may be formed by a same patterning process, and accordingly, the conductive patterns 110, 120, and 130 may include the same materials and be located on the same layer. Although FIG. 5 illustrates that the conductive patterns 110, 120, and 130 are located on the gate insulating layer GI, exemplary embodiments are not limited thereto. The conductive patterns 110, 120, and 130 in the first pixel PXL may be referred to as the first conductive pattern 110, the second conductive pattern 120, and the dummy pattern unit 130, respectively. A third conductive pattern 140 may also be included in the second pixel PXL' along with the conductive patterns 110, 120, and 130.

The first conductive pattern 110 may extend on the substrate 100 in a first direction (x-axis direction), and such first conductive pattern 110 may be the gate line GL. In an embodiment, the second conductive pattern 120 is nearest to the first conductive pattern 110 among conductive patterns located on a first side of the first conductive pattern 110 and arranged in a second direction (y-axis direction) that is perpendicular to the first direction (x-axis direction). A first surface of the second conductive pattern 120 may function as a first gate electrode g1 of a first TFT T1, and a second surface of the second conductive pattern 120 may function as a lower electrode C1 of the capacitor Cst. The second conductive pattern 120 may be formed in various ways.

The dummy pattern unit 130 may be located on the same layer as the first and second conductive patterns 110 and 120 and located at a second side of the first conductive pattern 110 which is opposite to the first side of the first conductive pattern 110. That is, the second conductive pattern 120 may extend in a direction (−y-axis direction) and be located at the second side of the first conductive pattern 110 that extends in the first direction (x-axis direction), and the dummy pattern unit 130 may be located at the first side of the first conductive pattern 110 and extend in a direction (+y-axis direction). Alternatively, the dummy pattern unit 130 may extend in the first direction (x-axis direction) along the first conductive pattern 110.

As shown in FIG. 4, the dummy pattern unit 130 may include a plurality of dummy patterns DM that are spaced apart. The plurality of dummy patterns DM may be formed along the first conductive pattern 110 in the first direction (x-axis direction). Although not illustrated, according to an exemplary embodiment, the plurality of dummy patterns DM are spaced apart from each other in the first direction (x-axis direction) along the first conductive pattern 110 and formed or arranged into a zigzag pattern. According to an exemplary embodiment, the plurality of dummy patterns DM are connected to each other. In an embodiment, the dummy pattern unit 130 is insulated from the first conductive pattern 110 (e.g., the gate line connected to a first pixel), insulated from the second conductive pattern 120 (e.g., the gate electrode g1 of the first transistor T1 and the capacitor Cst of the first pixel), and insulated from the third conductive pattern 140 (the gate electrode g1' and the capacitor c1' of a second pixel adjacent the first pixel).

As described above, FIG. 4 illustrates the first pixel PXL and the second pixel PXL' that are adjacent to each other. The first pixel PXL and the second pixel PXL' may include a first pixel electrode EL1 and a second pixel electrode EL', respectively. The first pixel PXL may include the first TFT T1 and the first pixel electrode EL1. The first TFT1 includes the first active pattern Act1 and the first gate electrode g1 that overlaps at least a portion of the first active pattern Act1, and the first pixel electrode EL1 that is electrically connected to the first TFT T1. Also, the second pixel PXL' may include a second TFT (not shown) and the second pixel electrode EL1'. The second TFT T2' includes a second active pattern (not shown) and a second gate electrode g' that overlaps at least a portion of the second active pattern, and the second pixel electrode EL1 that is electrically connected to the second TFT T2'. In this case, the first TFT T1 may be the driving TFT T1 of the first pixel PXL, and the second TFT T2' may be a driving TFT of the second pixel PXL'. In FIG. 4, dashes indicate locations on the conductive patterns 110, 120, and 130 where the first pixel electrode EL1 and the second pixel electrode EL' are to be arranged.

According to the present exemplary embodiment, the second conductive pattern 120 is the first gate electrode g1 of the first pixel PXL, and the third conductive pattern 140 is a second gate electrode g1' of the second pixel PXL'. According to exemplary embodiments, the conductive pattern 120 may be the first gate electrode g1 of the first pixel PXL and a lower electrode of a capacitor at the same time, and the third conductive pattern 140 may be a second gate electrode g1' of the second pixel PXL' and a lower electrode of a capacitor at the same time. However, exemplary embodiments are not limited thereto.

Referring to FIGS. 4 and 5, the first and second conductive patterns 110 and 120 are spaced apart by a first distance d1, and the first conductive pattern 110 and the dummy pattern unit 130 are spaced apart by a second distance d2 that is equal to or less than the first distance d1. The first conductive pattern 110 is spaced apart from the third conductive pattern 140, which is at the other side of the first conductive pattern 110 opposite to the second conductive pattern 120 at the side of the first conductive pattern 110, by a third distance d3. In an exemplary embodiment, the third distance d3 is greater than the first distance d1 or the second distance d2.

In an embodiment where the dummy pattern unit 130 is omitted, the second and third conductive patterns 120 and 140 are connected with the first conductive pattern 110. In this embodiment, as described above, the first and second conductive patterns 110 and 120 are conductive patterns that form the first pixel PXL and are spaced apart from each other by the first distance d1, and the first conductive pattern 110 and the third conductive pattern 140 are conductive patterns that respectively form the first pixel PXL and the second pixel PXL', which are adjacent to each other, and are spaced apart from each other by the third distance d3. In an exemplary embodiment, the third distance d3 is greater than the first distance d1.

In an embodiment of the above-described circuit diagram, during a process of patterning the conductive patterns 110, 120, and 130 on the substrate 100, a taper angle of the side of the first conductive pattern 110 where the second conductive pattern 120 is located and spaced apart by a relatively short distance from the first conductive pattern 110 is different from a taper angle of the other side of the first conductive pattern 110 where the third conductive pattern 140 is located and spaced apart by a relatively long distance from the first conductive pattern 110. For example, light exposure and light interference occur at the other side of the first conductive pattern 110 during the patterning process due to the second conductive pattern 120 that is spaced apart by the first distance d1, and thus, the taper angle of the other side of the first conductive pattern 110 decreases. While, light exposure and light interference do not occur at the other side of the first conductive pattern 110, light is directly emitted onto the other side of the first conductive pattern 110 during the patterning process due to the third conductive pattern 140 that is spaced apart by a longer distance than the first distance d1, and thus, the taper angle of the other side of the first conductive pattern 110 increases. This phenomenon is likely to occur in a high-resolution display device in which distances between lines are small.

When the interlayer insulating layer IL is located on the first conductive pattern 110 in the embodiment where the taper angle of the first side of the first conductive pattern 110 has increased, the thickness of the interlayer insulating layer IL gradually increases at the first side of the first conductive pattern 110, whereas the interlayer insulating layer IL may be come cracked at the second side of the first conductive pattern 110 due to the increased taper angle. Such cracks may cause leakage of current that flows in the first conductive pattern 110 and thus lead to faults in the entire display apparatus.

Therefore, the TFT substrate 1 according to an exemplary embodiment includes the dummy pattern unit 130 that is arranged at the second side of the first conductive pattern 110 and spaced apart from the same by the second distance d2 that is equal to or less than the first distance d1. Accordingly, the second conductive pattern 120 and the dummy pattern unit 130 are respectively arranged at the first and second sides of the first conductive pattern 110 and respectively spaced apart from the first conductive pattern 110 by the first distance d1 and the second distance d2. Due to the second conductive pattern 120 and the dummy pattern unit 130, the taper angles of the first and second sides of the first conductive pattern 110 may be reduced by creating light exposure and light interference at the first and second sides of the first conductive pattern 110 during the patterning processes. Since the first and second sides of the first conductive pattern 110 are formed such that the taper angles thereof are gradual, cracking of the interlayer insulating layer IL on the first conductive pattern 110 may be prevented or reduced, and current leakage from the first conductive pattern 110 may be prevented or reduced, and thus, faults in a display apparatus due to the current leakage may be prevented or reduced.

Figure 6:
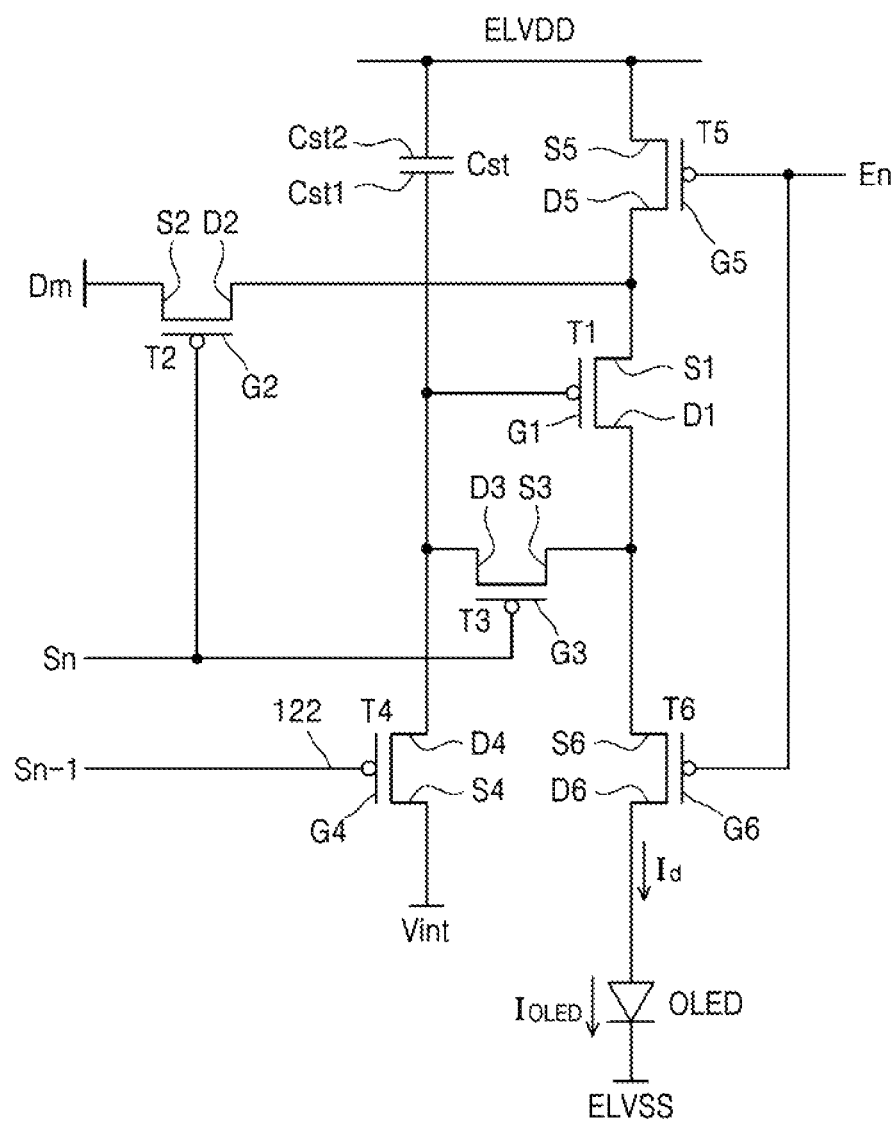
FIG. 6 is an equivalent circuit diagram of a pixel of a TFT substrate according to an exemplary embodiment of the inventive concept.
Figure 7:
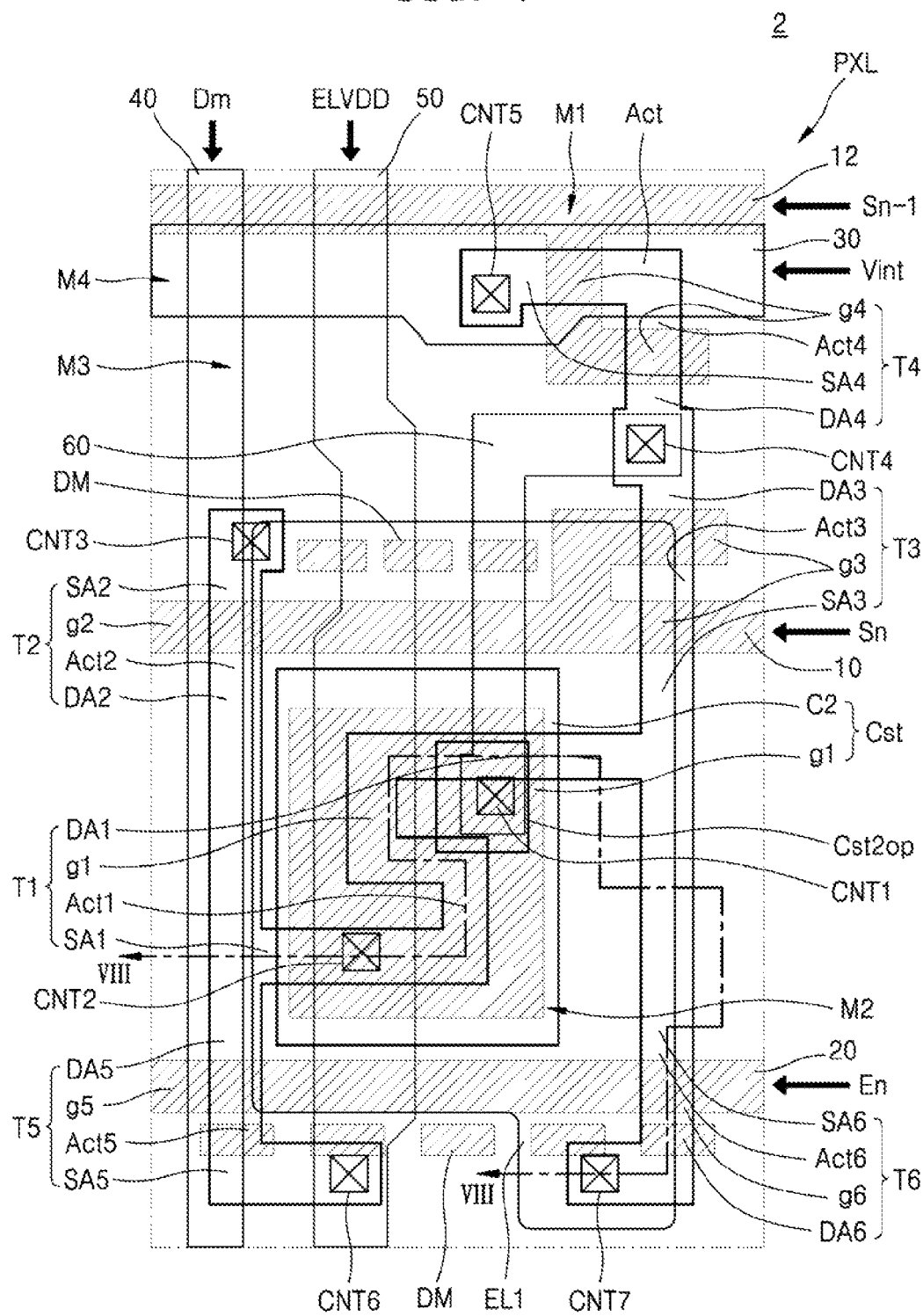
FIG. 7 is a schematic cross-sectional view of the TFT substrate according to the exemplary embodiment of FIG. 6.
Figure 8:
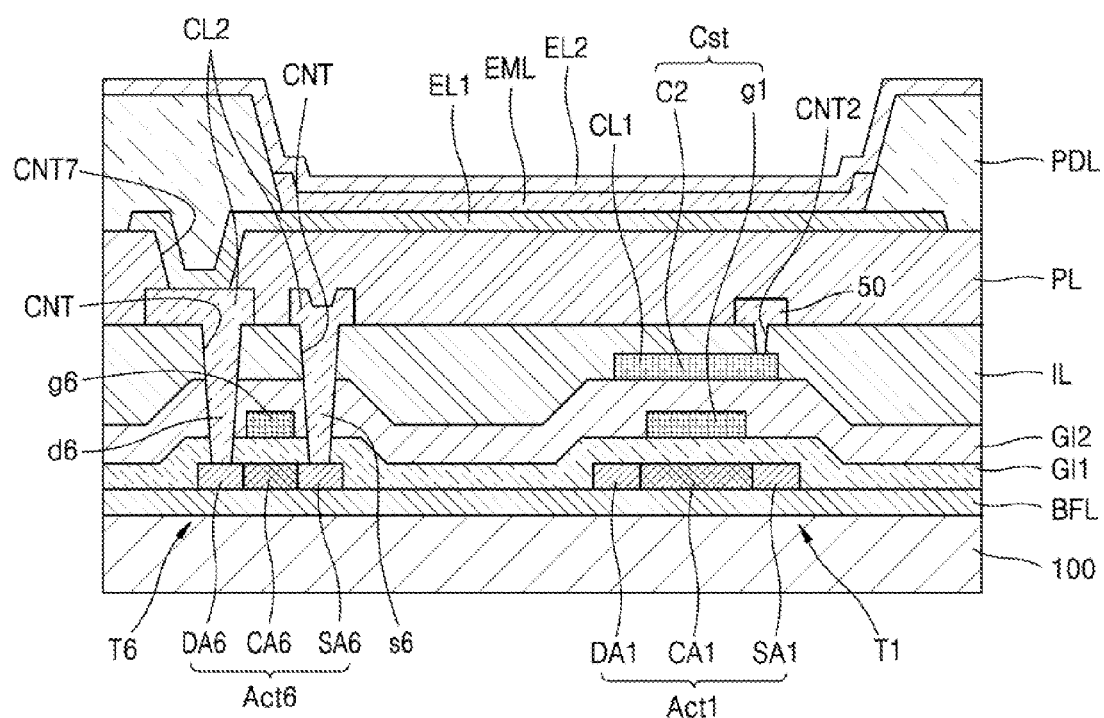
FIG. 8 is a schematic cross-sectional view of the TFT substrate of FIG. 7, cut along the line VIII-VIII of FIG. 7.

FIG. 6 is an equivalent circuit diagram of a pixel of a TFT substrate 2 according to an exemplary embodiment. FIG. 7 is a schematic cross-sectional view of the TFT substrate 2 according to the exemplary embodiment of FIG. 6. FIG. 8 is a schematic cross-sectional view of the TFT substrate 2 of FIG. 7 that is cut along the line VIII-VIII' of FIG. 7.

Referring to FIGS. 6 and 8, the TFT substrate 2 according to an exemplary embodiment includes a substrate 100, a first conductive pattern 110 on the substrate 100, a second conductive pattern 120, and a dummy pattern 130.

The substrate 100 may be formed of various materials, for example, a glass material, a metallic material, or a plastic material such as PET, PEN, and polyimide. The substrate 100 may include a display area in which a plurality of pixels PXL are located, and a peripheral area that surrounds the display area.

At least one pixel PXL, which displays an image, is provided on the substrate 100. When there are a plurality of pixels PXL, the pixels PXL may be arranged in a matrix form. However, only one pixel PXL is illustrated in the present exemplary embodiment for convenience of description. Although the pixel PXL is rectangular-shaped in FIG. 7, a shape of the pixel PXL is not limited thereto and may be modified in various ways. Also, the pixels PXL may have different sizes. For example, the pixels PXL with different colors may have different sizes or shapes according to a color of each pixel PXL.

Such a pixel PXL includes a driving TFT T1, a switching TFT T2, a compensation TFT T3, an initialization TFT T4, an operation control TFT T5, an emission control TFT T6, a storage capacitor Cst, and an OLED.

The pixel PXL includes a scan line 10 to which a scan signal Sn is applied, a previous scan line 12 to which a previous scan signal Sn-1 is applied, an emission control line 20 to which an emission control signal En is applied, an initialization voltage line 30 to which an initialization voltage Vint is applied, a data line 40 to which a data signal Dm is applied, and a driving voltage line 50 to which a driving voltage ELVDD is applied. The scan line 10, the previous scan line 12, the emission control line 20, and the initialization voltage line 30 extend in a row direction, whereas the data line 40 and the driving voltage line 50 extend in a column direction.

Figure 9:
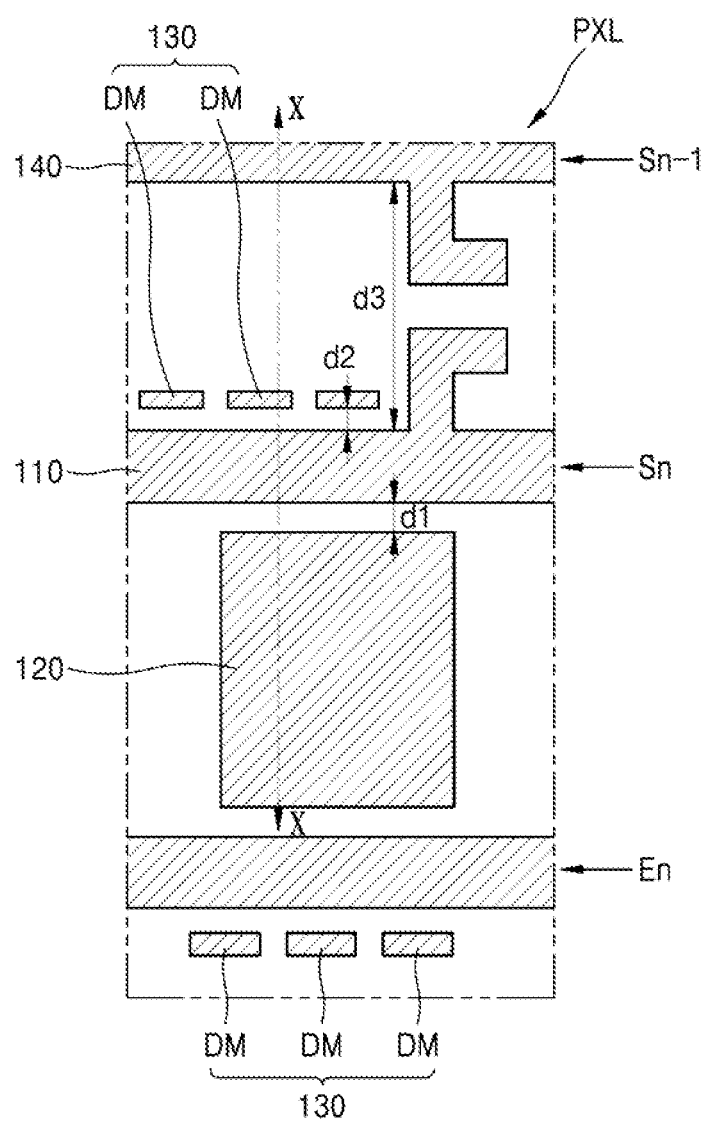
FIG. 9 is a schematic plan view of a layer of the TFT substrate of FIG. 7.

Referring to FIG. 9 that will be described later, according to the present exemplary embodiment, a first conductive pattern 110 corresponds to the scan line 10, a second conductive pattern 120 corresponds to the previous scan line 12, and a third conductive pattern 140 corresponds to the emission control line 20. Also, a dummy pattern 130 corresponds to a driving gate electrode g1 of the driving TFT T1, which will be described below. However, exemplary embodiments are not limited thereto, and a conductive pattern on the same layer may correspond to any line.

The pixel PXL includes an active pattern Act, a first conductive layer M1, a second conductive layer M2, a third conductive layer M3, and a fourth conductive layer M4. Although not illustrated, insulating layers may be provided among the active pattern Act, the first conductive layer M1, the second conductive layer M2, the third conductive layer M3, and the fourth conductive layer M4. Also, the pixel PXL may further include an intermediate layer (not shown) that includes an emission layer, and a common electrode layer (not shown).

The active pattern Act may include respective active patterns (Act1 to Act6) of the driving TFT T1, the switching TFT T2, the compensation TFT T3, the initialization TFT T4, the operation control TFT T5, and the emission control TFT T6. The driving TFT T1, the switching TFT T2, the compensation TFT T3, the initialization TFT T4, the operation control TFT T5, and the emission control TFT T6 may be arranged along the active pattern Act.

Although FIG. 7 illustrates that the active pattern Act is formed as a single pattern in the pixel PXL, the active pattern Act may be formed as two or more separated patterns according to alternate embodiments. The active pattern Act may have various shapes in alternate embodiments, and include curved portions as shown in FIG. 7.

The first conductive layer M1 may include the previous scan line 12, the scan line 10, and the emission control line 20. Also, the first conductive layer M1 may include respective gate electrodes (g1 to g6) of the driving TFT T1, the switching TFT T2, the compensation TFT T3, the initialization TFT T4, the operation control TFT T5, and the emission control TFT T6.

The second conductive layer M2 may include an upper electrode C2 of the storage capacitor Cst. The third conductive layer M3 may include the data line 40, the driving voltage line 50, and a connection line 60. The fourth conductive layer M4 may include the initialization voltage line 30 and the first electrode EL1.

The active pattern Act may be formed of polysilicon and a channel area that is not doped with impurities, a source area and a drain area that are doped with impurities and formed at both sides of the channel area. A type of the impurities may vary according to a type of a TFT. The impurities may be an n-type or a p-type. The active pattern Act may include a driving active pattern Act1 of the driving TFT T1, a switching active pattern Act2 of the switching TFT T2, a compensation active pattern Act3 of the compensation TFT T3, an initialization active pattern Act4 of the initialization TFT T4, an operation control active pattern Act5 of the operation control TFT T5, and an emission control active pattern Act6 of the emission control TFT T6.

The driving TFT T1 may include the driving active pattern Act1 and the driving gate electrode g1. The driving active pattern Act1 may include a channel area CA1 that overlaps the driving gate electrode g1, and a source area SA1 and a drain area DA1. The source area SA1 and the drain area DA1 do not overlap the driving gate electrode g1 and the upper electrode C2. In an exemplary embodiment, the driving active pattern Act1 is curved.

The second conductive layer M2, which includes the upper electrode C2 of the capacitor Cst, may be located on the driving gate electrode g1. The upper electrode C2 may be located on the driving gate electrode g1. The upper electrode C2 in the capacitor Cst may overlap at least one portion of the driving gate electrode g1. The upper electrode C2 may include an opening Cst2op that includes a contact hole CNT1 formed between the driving gate electrode g1 and the connection line 60. Although the opening Cst2op is quadrilateral-shaped in FIG. 7, a shape of the opening Cst2op is not limited thereto. The upper electrode C2 may completely overlap the driving gate electrode g1 except for an area of the driving gate electrode g1 corresponding to the opening Cst2op. In this case, capacitance may be at a maximum value.

The upper electrode C2 and the driving gate electrode g1 may form the capacitor Cst. The driving gate electrode g1 may also function as a lower electrode of the capacitor Cst. The upper electrode C2 may be connected to the driving voltage line 50 via a contact hole CNT2.

The switching TFT T2 may include the switching active pattern Act2, and a switching gate electrode g2 that is a portion of the scan line 10. The switching active pattern Act2 may include a channel area that overlaps the switching gate electrode g2, and a source area SA2 and a drain area DA2 at both sides of the channel area. The source area SA2 may be connected to the data line 40 via a contact hole CNT3. The drain area DA2 may be connected to the source area SA1 of the driving TFT T1 along the active pattern Act.

The compensation TFT T3 may include the compensation active pattern Act3, and a compensation gate electrode g3 that is a portion of the scan line 10. The compensation active pattern Act3 may include a channel area that overlaps the compensation gate electrode g3, and a source area SA3 and a drain area DA3 at both sides of the channel area. The source area SA3 may be connected to the drain area DA1 of the driving TFT T1 along the active pattern Act. The drain area DA3 may be connected to the connection line 60 via a contact hole CNT4. That is, the drain area DA3 of the compensation TFT T3 may be electrically connected to the driving gate electrode g1 via the connection line 60. As shown in FIG. 7, the compensation gate electrode g3 may be formed as a separate dual gate electrode and thus prevent current leakage.

The initialization TFT T4 may include the initialization active pattern Act4, and an initialization gate electrode g4 that is a portion of the previous scan line 12. The initialization active pattern Act4 may include a channel area that overlaps the initialization gate electrode g4, and a source area SA4 and a drain area DA4 at both sides of the channel area. The source area SA4 may be connected to the initialization voltage line 30 via a contact hole CNT5. The contact hole CNT5 may include a connecting unit formed by using the third conductive layer M3, a contact hole that connects the connecting unit and the source area SA4, and although not illustrated in FIG. 7, another contact hole that connects the connecting unit and the initialization voltage line 30. The drain area DA4 may be connected to the connection line 60 via the contact hole CNT4. As shown in FIG. 7, the initialization gate electrode g4 may be formed as a separate dual gate electrode.

The operation control TFT T5 may include the operation control active pattern Act5, and an emission gate electrode g5 that is a portion of the emission control line 20. The operation control active pattern Act5 may include a channel area that overlaps the operation control gate electrode g5, and a source area SA5 and a drain area DA5 at both sides of the channel area. The drain area DA5 may be connected to the source area SA1 of the driving TFT T1 along the active pattern Act. The source area SA5 may be connected to the driving voltage line 50 via a contact hole CNT6.

The emission control TFT T6 may include the emission control active pattern Act6, and an emission control gate electrode g6 that is a portion of the emission control line 20. The emission control active pattern Act6 includes a channel area CA6 that overlaps the emission control gate electrode g6, and a source area SA6 and a drain area DA6 at both sides of the channel area. In an embodiment, the source area SA6 is connected to the drain area DA1 of the driving TFT T1 along the active pattern Act. The drain area DA6 may be connected to the first electrode EU via a contact hole CNT7. Although not illustrated in FIG. 7, the contact hole CNT7 may include a connecting unit formed by using the third conductive layer M3, a contact plug that connects the connecting unit and the drain area DA6, and another contact plug that connects the connecting unit and the first electrode EL1.

The first electrode EL1 may be located on the upper electrode C2, and supply current to an intermediate layer (not shown) that includes an organic emission layer and is located on the first electrode EL1. The current applied to the intermediate layer is transmitted to a common electrode (not shown) on the intermediate layer.

The plan view shown in FIG. 7 is an exemplary embodiment of the inventive concept. The TFT substrate 2 may be modified in alternate embodiments.

FIG. 8 is a schematic cross-sectional view of the TFT substrate 2 of FIG. 7 that is cut along the line VIII-VIII' of FIG. 7. Hereinafter, referring to FIG. 8, the TFT substrate 2 according to an exemplary embodiment will be described according to a stacking order.

Referring to FIG. 8, the TFT substrate 2 according to an exemplary embodiment includes the driving TFT T1, the switching TFT T2, the compensation TFT T3, the initialization TFT T4, the operation control TFT T5, the emission control TFT T6, and the substrate 100 that is insulative and on which the storage capacitor Cst is stacked. An LCD or an OLED may be located on the substrate 100. According to the present exemplary embodiment, an example in which an OLED is located on the substrate 100 is described.

A buffer layer BFL may be located on the substrate 100. The buffer layer BFL may planarize an upper surface of the substrate 100 or block impurities from spreading into the driving TFT T1, the switching TFT T2, the compensation TFT T3, the initialization TFT T4, the operation control TFT T5, and the emission control TFT T6. The buffer layer BFL may be formed of, for example, silicon nitride, silicon oxide, or silicon oxynitride. The buffer layer BFL may be omitted according to a material of the substrate 100 and manufacturing conditions.

The driving TFT T1 and the emission control TFT T6 may be located on the buffer layer BFL. The upper electrode C2 is located on the driving TFT T1, and the driving gate electrode g1 and the upper electrode C2 form the storage capacitor Cst.

A lower gate insulating layer GI1 may be located between the driving and emission control active patterns Act1 and Act6 and the driving and emission control gate electrodes g1 and g6 so that the driving and emission control active patterns Act1 and Act6 are insulated from the driving and emission control gate electrodes g1 and g6. An upper gate insulating layer GI2 may be located between the driving gate electrode g1 and the upper electrode C2 so that the driving gate electrode g1 is insulated from the upper electrode C2. The upper gate insulating layer GI2 may be a dielectric layer between the driving gate electrode g1 and the upper electrode C2. The driving TFT T1, the storage capacitor Cst, and the emission control TFT T6 may be covered by the insulating layer IL.

According to the present exemplary embodiment, the lower gate insulating layer GI1 and the upper gate insulating layer GI2 may be formed of silicon oxide and/or silicon nitride.

According to the present exemplary embodiment, the driving gate electrode g1 may be formed of a conductive metallic material. According to the present exemplary embodiment, the driving gate electrode g1 may include aluminum Al. Since Al may provide a better manufacturing margin than other metallic materials, Al is useful for manufacturing a TFT substrate that displays a high-resolution image.

A first conductive layer CL1 that includes the upper electrode C2 of the storage capacitor Cst may be located on the second gate insulating layer GI2.

The first conductive layer CL1 of FIG. 8 may be regarded as the second conductive layer M2 of FIG. 7. The upper electrode C2 may overlap at least one portion of the driving gate electrode g1. The driving gate electrode g1 may be used as a lower electrode, and thus, the driving gate electrode g1 and the upper electrode C2 may form the storage capacitor Cst.

The insulating layer IL may be located on the upper electrode C2 of the storage capacitor Cst to cover the upper electrode C2 of the storage capacitor Cst. In this case, the insulating layer IL may be referred to as an interlayer insulating layer IL. The interlayer insulating layer IL may be formed as a single layer or a plurality of layers of silicon oxide or silicon nitride.

The contact hole CNT2, which exposes a portion of the upper electrode C2 of the storage capacitor Cst, may be formed in the interlayer insulating layer IL. Also, a contact hole CNT, which exposes the source and drain areas SA6 and DA6 of the emission control active pattern Act6 of the emission control TFT T6, may be formed in the interlayer insulating layer IL. The contact hole CNT may penetrate through the upper gate insulating layer GI2 and the lower gate insulating layer GI1 and extend to an upper portion or upper surface of the emission control active pattern Act6. The emission control TFT T6 may be electrically connected to the first electrode EL1 of the OLED via the contact hole CNT.

A power line 50 that applies a power voltage to the upper electrode C2 of the storage capacitor Cst, and a second conductive layer CL2 that includes a source electrode s6 and a drain electrode d6 of the emission control TFT T6 may be located on the interlayer insulating layer IL. The second conductive layer CL2 of FIG. 8 may be regarded as the third conductive layer M3 of FIG. 7. The upper electrode C2 of the storage capacitor Cst may be electrically connected to the power line 50 via a conductive material filled in the contact hole CNT2. The power line 50 may be regarded as the driving voltage line 50. The contact hole CNT2 may be modified in various ways. For example, the contact hole CNT2 may be more than one hole.

The drain area DA6 of the emission control TFT T6 may be electrically connected to the drain electrode d6 via the contact hole CNT that penetrates through the lower gate insulating layer GI1, the upper gate insulating layer GI2, and the interlayer insulating layer IL. Also, the source area SA6 of the emission control TFT T6 may be electrically connected to the source electrode s6 via the contact hole CNT that penetrates through the lower gate insulating layer GI1, the upper gate insulating layer GI2, and the interlayer insulating layer IL.

The driving voltage line 50 and the second conductive layer CL2 that includes the source and drain electrodes s6 and d6 may be formed as a single layer formed of at least one conductive material selected from, for example, Al, Pt, Pd, Ag, Mg, Au, Ni, Nd, Ir, Cr, Li, Ca, Mo, Ti, W, and Cu, or multiple layers of the conductive material.

The planarizing layer PL may be located to cover the source electrode s6, the drain electrode d6, and the driving voltage line 50 on the interlayer insulating layer IL. The planarizing layer PL may be formed of, for example, an inorganic insulating material including an oxide, a nitride, and/or an oxynitride, or an organic insulating material such as an acryl-based material or BCB. The planarizing layer PL may function as a protection layer that protects the driving TFT T1, the switching TFT T2, the compensation TFT T3, the initialization TFT T4, the operation control TFT T5, and the emission control TFT T6, or may planarize upper surfaces of the driving TFT T1, the switching TFT T2, the compensation TFT T3, the initialization TFT T4, the operation control TFT T5, and the emission control TFT T6.

A display device may be located on the TFT substrate 2. According to the present exemplary embodiment, the OLED is located as the display device. The OLED may include the first electrode EL1, the second electrode EL2, and an intermediate layer that includes the emission layer EML that is located between the first and second electrodes EL1 and EL2.

The first electrode EL1 of the OLED may be located on the planarizing layer PL. The first electrode EL1 may be a pixel electrode. In an exemplary embodiment, the first electrode EL1 is electrically connected to the drain electrode d6 of the emission control TFT T6 via a contact hole CNT7 formed in the planarizing layer PL.

The first electrode EL1 may be formed by using a high work function material. If the substrate 100 is a bottom emission type in which an image is displayed in a downward direction with respect to the substrate 100, the first electrode EL1 may be formed as a transparent conductive layer formed of ITO, IZO, ZnO, and ITZO. According to an exemplary embodiment, if the substrate 100 is a top emission type in which an image is displayed in an upward direction with respect to the substrate 100, the first electrode EL1 may be formed as a metal reflective film formed of Ag, Mg, Al, Pt, Pd, Au, Ni, Nd, Ir, or Cr, or a transparent conductive layer formed of ITO, IZO, ZnO, or ITZO.

A pixel defining layer PDL that defines an emission area with respect to each pixel may be located on the substrate 100. The pixel defining layer PDL may be formed such that a boundary of a pixel is covered and an upper surface of the first electrode EL1 is exposed.

The emission layer EML is provided on a portion of the first electrode EL1 which is exposed by the pixel defining layer PDL, and the second electrode EL2 may be located on the emission layer EML. For example, the pixel defining layer PDL may include a first part and a second part, where the emission layer EML is located between the first and second parts.

The emission layer EML may emit one selected from red light, green light, and blue light. According to an exemplary embodiment, the emission layer EML emits white light, and a display apparatus may additionally include red, green, and blue color filter layers (not shown) to output images with various colors.

Although not illustrated, according to at least one exemplary embodiment, a lower common layer is located between the first electrode EL1 and the emission layer EML, and an upper common layer is located between the emission layer EML and the second electrode EL2. The lower common layer and the upper common layer function as carrier transport layers, and may be commonly stacked on each pixel. The lower common layer may include an HIL and an HTL, and the upper common layer may include an EIL and an ETL. According to the present exemplary embodiment, when the first electrode EL1 is a pixel electrode, the lower common layer, the upper common layer, and the emission layer EML may be stacked on the first electrode EL1 in the following order: the HIL, the HTL, the emission layer EML, the ETL, the EIL, and the second electrode EL2. However, exemplary embodiments are not limited thereto, and the lower common layer and the upper common layer may be modified if necessary.

The second electrode EL2 may be stacked over an entire surface of the substrate 100. For example, the second electrode EL2 may entirely cover the pixel defining layer PDL and the emission layer EML. In this case, the second electrode EL2 may be a transparent electrode or a reflective electrode. When the second electrode EL2 is used as a transparent electrode, the second electrode EL2 may include a first layer formed of one selected from ITO, IZO, ZnO, and $In_2O_3$, and a combination thereof, and a second layer that is formed on the first layer and includes one selected from Li, Ca, LiF/Ca, LiF/Al, Al, Mg. The second layer may be formed as an auxiliary electrode or a bus electrode line. When the second electrode EL2 is used as a reflective electrode, one selected from Li, Ca, LiF/Ca, LiF/Al, Al, Mg, and a combination thereof is deposited on an entire surface of the substrate 100.

Although not illustrated, an encapsulating layer may be formed on the second electrode EL2. The encapsulating layer may be formed by stacking a plurality of inorganic layers or alternately stacking an organic layer and an inorganic layer.

According to an exemplary embodiment, an encapsulating substrate (not shown) is located on the second electrode EL2. The substrate 100 may be sealed by the encapsulating substrate.

Figure 10:
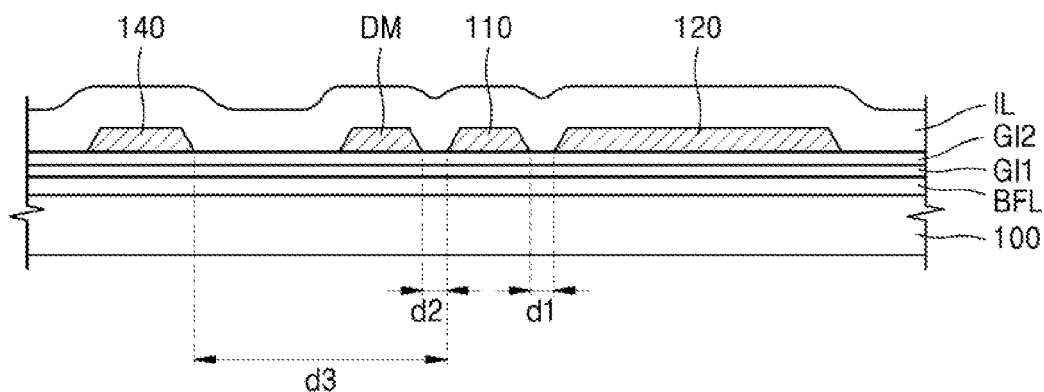
FIG. 10 is a schematic cross-sectional view of the TFT substrate of FIG. 9, cut along the line X-X of FIG. 9.

FIG. 9 is a schematic plan view of a layer of the TFT substrate 2 of FIG. 7, and FIG. 10 is a schematic cross-sectional view of the TFT substrate 2 of FIG. 9 that is cut along the line X-X' of FIG. 10.

Referring back to FIG. 7, according to the present exemplary embodiment, the first conductive pattern 110 may correspond to the scan line 10, the second conductive pattern 120 may correspond to the previous scan line 12, and the third conductive pattern 140 may correspond to the emission control line 20. Also, the dummy pattern unit 130 may correspond to the driving gate electrode g1 of the driving TFT T1, which will be described below. However, exemplary embodiments are not limited thereto, and a conductive pattern on the same layer may correspond to any line.

Referring to FIG. 9, the conductive patterns 110, 120, and 130 may be located on the gate insulating layer GI that is located on the substrate 100. In an embodiment, a same patterning process is used to form the conductive patterns 110, 120, and 130, and accordingly, the conductive patterns 110, 120, and 130 may include the same materials and be located on the same layer. Although FIG. 9 illustrates that the conductive patterns 110, 120, and 130 are located on the gate insulating layer GI, exemplary embodiments are not limited thereto. The conductive patterns 110, 120, and 130 in the pixel PXL may be referred to as the first conductive pattern 110, the second conductive pattern 120, and the dummy pattern unit 130, respectively. The first conductive pattern 110 may extend on the substrate 100 in the first direction (x-axis direction), and such first conductive pattern 110 may be a gate line. In an embodiment, the second conductive pattern 120 is nearest to a side of the first conductive pattern 110 and arranged in the second direction (y-axis direction) that is perpendicular to the first direction (x-axis direction). A side of the second conductive pattern 120 may function as a first gate electrode of a first TFT, and the other side of the second conductive pattern 120 may function as a first capacitor electrode of a capacitor. The conductive patterns 110, 120, and 130 may be formed in various ways.

The dummy pattern unit 130 may be located on the same layer as the first and second conductive patterns 110 and 120, and located at the other side of the first conductive pattern 110 which is opposite to the side of the first conductive pattern 110. That is, the second conductive pattern 120 may be located in a direction (−y-axis direction) toward the side of the first conductive pattern 110 that extends in the first direction (x-axis direction), and the dummy pattern unit 130 may be located in a direction (+y-axis direction) toward the other side of the first conductive pattern 110. Alternatively, the dummy pattern unit 130 may extend in the first direction (x-axis direction) along the first conductive pattern 110.

As shown in FIG. 9, the dummy pattern unit 130 may include a plurality of dummy patterns DM that are spaced apart. The plurality of dummy patterns DM may be formed along the first conductive pattern 110 in the first direction (x-axis direction). Although not illustrated, according to an exemplary embodiment, the plurality of dummy patterns DM are spaced apart from each other in the first direction (x-axis direction) along the first conductive pattern 110 and formed in a zigzag pattern. According to an exemplary embodiment, the plurality of dummy patterns DM are connected to each other.

In FIG. 9, a third conductive pattern 140 that extends in the same direction as the first conductive pattern 110, i.e., the first direction (x-axis direction), may be further provided on the same layer as the first conductive pattern 110. The third conductive pattern 140 may be nearest to a side of the dummy pattern unit 130 which is opposite to the other side of the dummy pattern unit 130 where the first conductive pattern 110 is located. According to the present exemplary embodiment, the first conductive pattern 110 may be a scan line, and the third conductive pattern 140 may be a previous scan line. However, exemplary embodiments are not limited thereto.

As described above, TFTs may be located on the TFT substrate 2 according to the present exemplary embodiment. From among the TFTs, a driving TFT may include an active pattern and a gate electrode that overlaps at least a portion of the active pattern, as described above. The second conductive pattern 120 according to the present exemplary embodiment may be a gate electrode of the driving TFT. In an exemplary embodiment, the second conductive pattern 120 may be the gate electrode of the driving TFT and a lower electrode of a capacitor at the same time.

Referring to FIGS. 9 and 10, the first and second conductive patterns 110 and 120 are separated by a first distance d1, and the first conductive pattern 110 and the dummy pattern unit 130 are separated by a second distance d2 that is the same as or smaller than the first distance d1. The first conductive pattern 110 may be separated from the third conductive pattern 140, which is at the other side of the first conductive pattern 110 that is opposite to the second conductive pattern 120 at the side of the first conductive pattern 110, by a third distance d3. In an embodiment, the third distance d3 is greater than the first distance d1 or the second distance d2.

In an embodiment where the dummy pattern unit 130 is omitted, the second and third conductive patterns 120 and 140 are connected with the first conductive pattern 110. In this embodiment, as described above, the first and second conductive patterns 110 and 120 are conductive patterns that form the first pixel PXL and separated from each other by the first distance d1, and the first conductive pattern 110 and the third conductive pattern 140 are conductive patterns that respectively form the first pixel PXL and the second pixel PXL', which are adjacent to each other, and separated from each other by the third distance d3 that is greater than the first distance d1.

In an embodiment of the above-described circuit diagram, during a process of patterning the conductive patterns 110, 120, and 130 on the substrate 100, a taper angle of the side of the first conductive pattern 110 where the second conductive pattern 120 is located and spaced apart by a relatively short distance from the first conductive pattern 110 is different from a taper angle of the other side of the first conductive pattern 110 where the third conductive pattern 140 is located and separated by a relatively long distance from the first conductive pattern 110. That is, light exposure and light interference occur at the other side of the first conductive pattern 110 during the patterning process due to the second conductive pattern 120 that is separated by the first distance d1, and thus, the taper angle of the other side of the first conductive pattern 110 decreases. While, light exposure and light interference do not occur at the other side of the first conductive pattern 110, light is directly emitted onto the other side of the first conductive pattern 110 during the patterning process due to the third conductive pattern 140 that is separated by a longer distance than the first distance d1, and thus, the taper angle of the other side of the first conductive pattern 110 increases. This phenomenon is likely to occur in a high-resolution display device in which widths between lines are small.

When the interlayer insulating layer IL is located on the first conductive pattern 110 in the embodiment where the taper angle of the side of the first conductive pattern 110 has increased, the interlayer insulating layer IL gradually increases at the side of the first conductive pattern 110, whereas the interlayer insulating layer IL may become cracked at the other side of the first conductive pattern 110 due to the increased taper angle. Such cracks cause leakage of current that flows into the first conductive pattern 110 and may lead to fault in the entire display apparatus.

Therefore, the TFT substrate 2 according to an exemplary embodiment includes the dummy pattern unit 130 that is arranged at the other side of the first conductive pattern 110 and separated by the second distance d2 that is the same as or smaller than the first distance d1. Accordingly, the second conductive pattern 120 and the dummy pattern unit 130 are arranged at both sides of the first conductive pattern 110 and respectively separated from the first conductive pattern 110 by the first distance d1 and the second distance d2. Due to the second conductive pattern 120 and the dummy pattern unit 130, the taper angles of the both sides of the first conductive pattern 110 may be reduced by creating light exposure and light interference at the both sides of the first conductive pattern 110 during the patterning processes. Since the taper angles of the both sides of the first conductive pattern 110 are formed in the same gradual manner, the interlayer insulating layer IL on the first conductive pattern 110 may be prevented from being cracked, current may be prevented from leaking on the first conductive pattern 110, and thus faults in a display apparatus due to the current leakage may be reduced.

Although a TFT substrate and a display apparatus that includes the TFT substrate is mainly described above, exemplary embodiments of the inventive concept are not limited thereto. For example, a method of manufacturing the TFT substrate and a method of manufacturing the display apparatus are also within the scope of the inventive concept.

First, referring to FIGS. 1 to 5, a method of manufacturing the TFT substrate 1 according to an exemplary embodiment includes forming the conductive patterns 110, 120, and 130 on the substrate 100. The conductive patterns 110, 120, and 130 may be formed during the same patterning process, and accordingly, the conductive patterns 110, 120, and 130 may include the same material and be formed on the same layer. The forming of the conductive patterns 110, 120, and 130 on the substrate 100 may include forming the first conductive pattern 110 on the substrate 100, forming the second conductive pattern 120 on the substrate 100, and forming the dummy pattern unit 130 on the substrate 100. According to the present exemplary embodiment, the conductive patterns 110, 120, and 130 are formed on a gate insulating layer after a buffer layer and the gate insulating layer are formed on the substrate 100. However, exemplary embodiments are not limited thereto.

The first conductive pattern 110 may be formed such that the first conductive pattern 110 extends on the substrate 100 in the first direction (x-axis direction). According to the present exemplary embodiment, the first conductive pattern 110 may be a gate line.

The second conductive pattern 120 may be formed such that the second conductive pattern 120 is nearest to a side of the first conductive pattern 110 in the second direction (y-axis direction) that is perpendicular to the first direction (x-axis direction). A side of the second conductive pattern 120 may function as a first gate electrode of a first TFT, and the other side of the second conductive pattern 120 may function as a first capacitor electrode of a capacitor. The second conductive pattern 120 may be formed in various ways.

The dummy pattern unit 130 may be formed on the same layer as the first and second conductive patterns 110 and 120, and patterned such that the dummy pattern unit 130 is located at the other side of the first conductive pattern 110 which is opposite to the side of the first conductive pattern 110 adjacent the second conductive pattern 120. That is, the second conductive pattern 120 may be located in a direction (−y-axis direction) toward a side of the first conductive pattern 110 that extends in the first direction (x-axis direction), and the dummy pattern unit 130 may be located in a direction (+y-axis direction) toward the other side of the first conductive pattern 110. Alternatively, the dummy pattern unit 130 may extend in the first direction (x-axis direction) along the first conductive pattern 110.

The forming of the dummy pattern unit 130 may include forming a plurality of dummy patterns DM. The plurality of dummy patterns DM may be separated from each other. The plurality of dummy patterns DM may be formed along the first conductive pattern 110 in the first direction (x-axis direction). Although not illustrated, according to an exemplary embodiment, the plurality of dummy patterns DM is separated along the first conductive pattern 110 in the first direction (x-axis direction) in a zigzag pattern. According to an exemplary embodiment, the plurality of dummy patterns DM are connected to each other.

FIG. 4 illustrates the first pixel PXL and the second pixel PXL' that are adjacent to each other. After the conductive patterns 110, 120, and 130 are formed in each of the first pixel PXL and the second pixel PXL', the planarizing layer PL may be formed on the conductive patterns 110, 120, and 130, and then, a first pixel electrode and a second pixel electrode may be formed. In FIG. 4, dashes indicate locations on the conductive patterns 110, 120, and 130 where the first and second pixel electrodes are to be arranged.

That is, as described above, the first pixel PXL may include a first active pattern, a first TFT including a first gate electrode that overlaps at least a portion of the first active pattern, and a first pixel electrode that is electrically connected to the first TFT. Also, the second pixel PXL' may include a second active pattern, a second TFT that includes a second gate electrode that overlaps at least a portion of the second active pattern, and a second pixel electrode that is electrically connected to the second TFT. In this case, the first TFT may be a driving TFT of the first pixel PXL, and the second TFT may be a driving TFT of the second pixel PXL'.

According to the present exemplary embodiment, the second conductive pattern 120 may be a first gate electrode of the first pixel PXL, and the third conductive pattern 140 may be a second gate electrode of the second pixel PXL'. According to exemplary embodiments, the second conductive pattern 120 may be the first gate electrode of the first pixel PXL and a lower electrode of a capacitor at the same time, and the third conductive pattern 140 may be a second gate electrode of the second pixel PXL' and a lower electrode of a capacitor at the same time. However, exemplary embodiments are not limited thereto. In this embodiment, the first to third conductive patterns 110, 120, and 140 may be formed at the same time.

Referring to FIGS. 4 and 5, the first and second conductive patterns 110 and 120 may be separated by a first distance d1, and the first conductive pattern 110 and the dummy pattern unit 130 may be separated by a second distance d2 that is the same as or smaller than the first distance d1. The first conductive pattern 110 may be separated from the third conductive pattern 140, which is at the other side of the first conductive pattern 110 that is opposite to the second conductive pattern 120 at the side of the first conductive pattern 110, by a third distance d3. In an embodiment, the third distance d3 is greater than the first distance d1 or the second distance d2.

In an embodiment where the dummy pattern unit 130 is omitted, the second and third conductive patterns 120 and 140 are connected with the first conductive pattern 110. In this embodiment, as described above, the first and second conductive patterns 110 and 120 are conductive patterns that form the first pixel PXL and separated from each other by the first distance d1, and the first conductive pattern 110 and the third conductive pattern 140 are conductive patterns that respectively form the first pixel PXL and the second pixel PXL', which are adjacent to each other, and separated from each other by the third distance d3 that is greater than the first distance d1.

In an embodiment of the above-described circuit diagram, during a process of patterning the conductive patterns 110, 120, and 130 on the substrate 100, a taper angle of the side of the first conductive pattern 110 where the second conductive pattern 120 is located and separated by a relatively short distance from the first conductive pattern 110 is different from a taper angle of the other side of the first conductive pattern 110 where the third conductive pattern 140 is located and separated by a relatively long distance from the first conductive pattern 110. That is, light exposure and light interference occur at the other side of the first conductive pattern 110 during the patterning process due to the second conductive pattern 120 that is separated by the first distance d1, and thus, the taper angle of the other side of the first conductive pattern 110 decreases. On the other hand, light exposure and light interference do not occur at the other side of the first conductive pattern 110, but light is directly emitted onto the other side of the first conductive pattern 110 during the patterning process due to the third conductive pattern 140 that is separated by a longer distance than the first distance d1, and thus, the taper angle of the other side of the first conductive pattern 110 increases. This phenomenon is likely to occur in a high-resolution display device in which widths between lines are small.

When the interlayer insulating layer IL is located on the first conductive pattern 110 in the embodiment where the taper angle of the side of the first conductive pattern 110 has increased, the interlayer insulating layer IL gradually increases at the side of the first conductive pattern 110, whereas the interlayer insulating layer IL may become cracked at the other side of the first conductive pattern 110 due to the increased taper angle. Such cracks cause leakage of current that flows into the first conductive pattern 110 and may lead to fault in the entire display apparatus.

Therefore, the TFT substrate 1 according to an exemplary embodiment includes the dummy pattern unit 130 that is arranged at the other side of the first conductive pattern 110 and separated by the second distance d2 that is the same as or smaller than the first distance d1. Accordingly, the second conductive pattern 120 and the dummy pattern unit 130 are arranged at both sides of the first conductive pattern 110 and respectively separated from the first conductive pattern 110 by the first distance d1 and the second distance d2. Due to the second conductive pattern 120 and the dummy pattern unit 130, the taper angles of the both sides of the first conductive pattern 110 may be reduced by creating light exposure and light interference at the both sides of the first conductive pattern 110 during the patterning processes. Since the taper angles of the both sides of the first conductive pattern 110 are formed in the same gradual manner, the interlayer insulating layer IL on the first conductive pattern 110 may be prevented from being cracked, current may be prevented from leaking on the first conductive pattern 110, and thus faults in a display apparatus due to the current leakage may be reduced.

Referring to FIGS. 6 to 10, a method of forming the TFT substrate 2 according to an exemplary embodiment may include forming the conductive patterns 110, 120, and 130 on the substrate 100. The conductive patterns 110, 120, and 130 may be formed during the same patterning process, and accordingly, the conductive patterns 110, 120, and 130 may include the same material and be formed on the same layer. The forming of the conductive patterns 110, 120, and 130 on the substrate 100 may include forming the first conductive pattern 110 on the substrate 100, forming the second conductive pattern 120 on the substrate 100, and forming the dummy pattern unit 130 on the substrate 100. According to the present exemplary embodiment, the conductive patterns 110, 120, and 130 are formed on a gate insulating layer after a buffer layer and the gate insulating layer are formed on the substrate 100. However, exemplary embodiments are not limited thereto.

The first conductive pattern 110 may be formed such that the first conductive pattern 110 extends on the substrate 100 in the first direction (x-axis direction). According to the present exemplary embodiment, the first conductive pattern 110 may be a gate line.

The second conductive pattern 120 may be formed such that the second conductive pattern 120 is nearest to a side of the first conductive pattern 110 in the second direction (y-axis direction) that is perpendicular to the first direction (x-axis direction). A side of the second conductive pattern 120 may function as a first gate electrode of a first TFT, and the other side of the second conductive pattern 120 may function as a first capacitor electrode of a capacitor. The second conductive pattern 120 may be formed in various ways.

The dummy pattern unit 130 may be formed on the same layer as the first and second conductive patterns 110 and 120, and patterned such that the dummy pattern unit 130 is located at the other side of the first conductive pattern 110 which is opposite to the side of the first conductive pattern 110 adjacent the second conductive pattern 120. That is, the second conductive pattern 120 may be located in a direction (−y-axis direction) toward a side of the first conductive pattern 110 that extends in the first direction (x-axis direction), and the dummy pattern unit 130 may be located in a direction (+y-axis direction) toward the other side of the first conductive pattern 110. Alternatively, the dummy pattern unit 130 may extend in the first direction (x-axis direction) along the first conductive pattern 110.

The forming of the dummy pattern unit 130 may include forming a plurality of dummy patterns DM. The plurality of dummy patterns DM may be separated from each other. The plurality of dummy patterns DM may be formed along the first conductive pattern 110 in the first direction (x-axis direction). Although not illustrated, according to an exemplary embodiment, the plurality of dummy patterns DM may be separated along the first conductive pattern 110 in the first direction (x-axis direction) in a zigzag pattern. According to an exemplary embodiment, the plurality of dummy patterns DM are connected to each other.

In FIG. 9, the method may further include forming the third conductive pattern 140 that is formed on the same layer as the first conductive pattern 110 according to the same manufacturing process as the first conductive pattern 110 and extends in the same direction as the first conductive pattern 110, i.e., the first direction (x-axis direction). The third conductive pattern 140 may be nearest to a side of the dummy pattern unit 130 which is opposite to the other side of the dummy pattern unit 130 where the first conductive pattern 110 is located. According to the present exemplary embodiment, the first conductive pattern 110 may be a scan line, and the third conductive pattern 140 may be a previous scan line. However, exemplary embodiments are not limited thereto.

As described above, TFTs may be located on the TFT substrate 2 according to the present exemplary embodiment. From among the TFTs, a driving TFT may include an active pattern and a gate electrode that overlaps at least a portion of the active pattern, as described above. The second conductive pattern 120 according to the present exemplary embodiment may be a gate electrode of the driving TFT. In some embodiments, the second conductive pattern 120 may be the gate electrode of the driving TFT and a lower electrode of a capacitor at the same time.

Referring to FIGS. 9 and 10, the first and second conductive patterns 110 and 120 may be separated by a first distance d1, and the first conductive pattern 110 and the dummy pattern unit 130 may be separated by a second distance d2 that is the same as or smaller than the first distance d1. The first conductive pattern 110 may be separated from the third conductive pattern 140, which is at the other side of the first conductive pattern 110 that is opposite to the second conductive pattern 120 at the side of the first conductive pattern 110, by a third distance d3. In an embodiment, the third distance d3 is greater than the first distance d1 or the second distance d2.

In an embodiment where the dummy pattern unit 130 is omitted, the second and third conductive patterns 120 and 140 are connected with the first conductive pattern 110. In this embodiment, as described above, the first and second conductive patterns 110 and 120 are conductive patterns that form the first pixel PXL and are separated from each other by the first distance d1, and the first conductive pattern 110 and the third conductive pattern 140 are conductive patterns that respectively form the first pixel PXL and the second pixel PXL', which are adjacent to each other, and are separated from each other by the third distance d3 that is greater than the first distance d1.

In an embodiment of the above-described circuit diagram, during a process of patterning the conductive patterns 110, 120, and 130 on the substrate 100, a taper angle of the side of the first conductive pattern 110 where the second conductive pattern 120 is located and separated by a relatively short distance from the first conductive pattern 110 is different from a taper angle of the other side of the first conductive pattern 110 where the third conductive pattern 140 is located and separated by a relatively long distance from the first conductive pattern 110. That is, light exposure and light interference occur at the other side of the first conductive pattern 110 during the patterning process due to the second conductive pattern 120 that is separated by the first distance d1, and thus, the taper angle of the other side of the first conductive pattern 110 decreases. While, light exposure and light interference do not occur at the other side of the first conductive pattern 110, light is directly emitted onto the other side of the first conductive pattern 110 during the patterning process due to the third conductive pattern 140 that is separated by a longer distance than the first distance d1, and thus, the taper angle of the other side of the first conductive pattern 110 increases. This phenomenon is likely to occur in a high-resolution display device in which widths between lines are small.

When the interlayer insulating layer IL is located on the first conductive pattern 110 in the embodiment where the taper angle of the side of the first conductive pattern 110 has increased, the interlayer insulating layer IL gradually increases at the side of the first conductive pattern 110, whereas the interlayer insulating layer IL may become cracked at the other side of the first conductive pattern 110 due to the increased taper angle. Such cracks cause leakage of current that flows into the first conductive pattern 110 and may lead to fault in the entire display apparatus.

Therefore, the TFT substrate 2 according to an exemplary embodiment includes the dummy pattern unit 130 that is arranged at the other side of the first conductive pattern 110 and separated by the second distance d2 that is the same as or smaller than the first distance d1. Accordingly, the second conductive pattern 120 and the dummy pattern unit 130 are arranged at both sides of the first conductive pattern 110 and respectively separated from the first conductive pattern 110 by the first distance d1 and the second distance d2. Due to the second conductive pattern 120 and the dummy pattern unit 130, the taper angles of the both sides of the first conductive pattern 110 may be reduced by creating light exposure and light interference at the both sides of the first conductive pattern 110 during the patterning processes. Since the taper angles of the both sides of the first conductive pattern 110 are formed in the same gradual manner, the interlayer insulating layer IL on the first conductive pattern 110 may be prevented from being cracked, current may be prevented from leaking on the first conductive pattern 110, and thus faults in a display apparatus due to the current leakage may be reduced.

In an exemplary embodiment, the first conductive pattern 110, the second conductive pattern 120, and the dummy pattern unit 130 are formed out of the same material.

A display device may be formed on the above-described TFT substrates 1 and 2. The display device may be an OLED or an LCD, as described above.

While exemplary embodiments of the inventive concept have been described above with reference to the figures, it will be understood by those of ordinary skill in the art that various changes in form and details may be made therein without departing from the spirit and scope the inventive concept.

What is claimed is:

1. A thin film transistor (TFT) substrate comprising:
   a substrate;
   a first conductive pattern located on the substrate and extends in a first direction;
   a second conductive pattern located on a same layer as the first conductive pattern nearest to the first conductive pattern among conductive patterns located adjacent a first side of the first conductive pattern, wherein the second conductive pattern extends in a second direction that is perpendicular to the first direction; and
   a dummy pattern unit located on the same layer as the first conductive pattern and located adjacent a second side of the first conductive pattern which is opposite to the first side of the first conductive pattern,
   wherein the second conductive pattern is part of a first gate electrode of a first TFT of a pixel.

2. The ITT substrate of claim 1, wherein the first and second conductive patterns are spaced apart by a first distance, and the first conductive pattern and the dummy pattern unit is spaced apart by a second distance that is equal to or less than the first distance.

3. The TFT substrate of claim 1, wherein the dummy pattern unit comprises a plurality of dummy patterns that are connected to or spaced apart front each other.

4. The TFT substrate of claim 3, wherein the plurality of dummy patterns are arranged in a zigzag pattern.

5. The ITT substrate of claim 1, further comprising a third conductive pattern located on the same layer as the first conductive pattern, nearest to the first conductive pattern among conductive patterns located adjacent a side of the dummy pattern unit which is opposite to another side of the dummy pattern unit where the first conductive pattern is located adjacently, wherein the third conductive pattern extends in the same first direction as the first conductive pattern,
   wherein the third conductive pattern is spaced apart from the first conductive pattern by a third distance that is greater than the first distance.

6. The TFT substrate of claim 5, further comprising: an active pattern, wherein the first gate electrode overlaps a portion of the active pattern.

7. The TFT substrate of claim 1, further comprising a third conductive pattern located on the same layer as the first conductive pattern and nearest among conductive patterns located adjacent a side of the dummy pattern unit which is opposite to another side of the dummy pattern unit where the first conductive pattern is located adjacently,
   wherein the third conductive pattern is spaced apart from the first conductive pattern by a third distance that is greater than the first distance.

8. The TFT substrate of claim 7, further comprising:
   a first active pattern that is part of the first TFT, where the first gate electrode overlaps a portion of the first active pattern;
   a first pixel electrode that is electrically connected to the first TFT;
   a second TFT that comprises a second active pattern and the third conductive pattern, where the third conductive pattern comprises a second gate electrode that overlaps a portion of the second active pattern; and
   a second pixel electrode that is electrically connected to the second TFT.

9. A display apparatus comprising:
the thin film transistor (TFT) substrate of claim 1; and
a display panel located on the TFT substrate.

10. The TFT substrate of claim 1, wherein the first conductive pattern is a gate line connected to a second gate electrode of a second TFT of the pixel.

11. A display device comprising:
- a substrate comprising first and second pixels that are adjacent one another;
- a dummy pattern located between the first and second pixels; and
- a first conductive pattern located on the substrate between the dummy pattern and the first pixel,
- wherein the first pixel comprises a first thin film transistor TFT and a second TFT, the first TFT comprising a second conductive pattern located on a same layer as the first conductive pattern and adjacent a side of the first conductive pattern that is opposite a side of the first conductive pattern adjacent the dummy pattern,
- wherein the first conductive pattern is a gate line connected to a first gate electrode of the second TFT.

12. The display device of claim 11, wherein the dummy pattern is located a first distance away from the first conductive pattern, wherein the second pixel comprises a third TFT, and wherein the third TFT comprises a third conductive pattern that is located a second distance away from the first conductive pattern that is larger than the first distance.

13. The TFT substrate of claim 11, wherein the second conductive pattern is part of a second gate electrode of the first TFT.

* * * * *